United States Patent
Tanaka et al.

(10) Patent No.: US 11,646,157 B2
(45) Date of Patent: May 9, 2023

(54) COMPONENT BUILT-IN SUBSTRATE

(71) Applicant: Murata Manufacturing Co., Ltd., Nagaokakyo (JP)

(72) Inventors: Yuichiro Tanaka, Nagaokakyo (JP); Hiroki Awata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 7 days.

(21) Appl. No.: 17/383,485

(22) Filed: Jul. 23, 2021

(65) Prior Publication Data

US 2022/0051852 A1 Feb. 17, 2022

(30) Foreign Application Priority Data

Aug. 13, 2020 (JP) .............................. JP2020-136632

(51) Int. Cl.
*H01G 4/232* (2006.01)
*H05K 1/18* (2006.01)
*H01G 4/30* (2006.01)

(52) U.S. Cl.
CPC ............ *H01G 4/2325* (2013.01); *H05K 1/185* (2013.01); *H01G 4/30* (2013.01); *H05K 2201/10015* (2013.01); *H05K 2201/10651* (2013.01)

(58) Field of Classification Search
CPC ........ H01G 4/2325; H01G 4/30; H01G 4/232; H05K 1/185; H05K 2201/10015; H05K 2201/10651; H05K 3/4602; H05K 2201/10636; H05K 2203/0191; H05K 2203/1469; Y02P 70/50
See application file for complete search history.

(56) References Cited

U.S. PATENT DOCUMENTS

| | | | | |
|---|---|---|---|---|
| 2014/0110153 A1* | 4/2014 | Kashiwagi | ............. | H05K 1/115 174/251 |
| 2014/0182911 A1* | 7/2014 | Lee | ........................ | H05K 1/185 29/832 |
| 2015/0109718 A1* | 4/2015 | Choi | ........................ | H01G 4/30 174/258 |

(Continued)

FOREIGN PATENT DOCUMENTS

| JP | 2002-203735 A | 7/2002 |
|---|---|---|
| JP | 2006-237078 A | 9/2006 |

(Continued)

*Primary Examiner* — David M Sinclair
*Assistant Examiner* — Daniel M Dubuisson
(74) *Attorney, Agent, or Firm* — Keating & Bennett, LLP

(57) ABSTRACT

A component built-in substrate includes a multilayer body and a substrate including a multilayer ceramic electronic component embedded therein. The multilayer ceramic electronic component includes a first connection portion that protrudes from the first external electrode, and a second connection portion that protrudes from the second external electrode. The substrate includes a core material. The multilayer ceramic electronic component including the first connection portion and the second connection portion includes a surface covered by the core material and embedded in the substrate. The first connection portion protrudes toward a surface of the substrate, and is not exposed at the surface of the substrate. The second connection portion protrudes toward the surface of the substrate, and is not exposed at the surface of the substrate.

7 Claims, 25 Drawing Sheets

(56) References Cited

U.S. PATENT DOCUMENTS

| | | | |
|---|---|---|---|
| 2015/0280251 A1* | 10/2015 | Takahashi | C22C 14/00 |
| | | | 429/509 |
| 2015/0318110 A1 | 11/2015 | Lee et al. | |
| 2016/0093441 A1* | 3/2016 | Ahn | H01G 2/065 |
| | | | 361/301.4 |
| 2017/0345569 A1 | 11/2017 | Sakatsume et al. | |
| 2018/0288884 A1* | 10/2018 | Ori | B32B 7/12 |
| 2018/0323010 A1* | 11/2018 | Park | H01G 2/065 |
| 2019/0069412 A1* | 2/2019 | Kim | H01G 4/2325 |
| 2019/0221369 A1* | 7/2019 | Park | H05K 1/111 |
| 2020/0029438 A1* | 1/2020 | Sasaki | H01G 4/30 |

FOREIGN PATENT DOCUMENTS

| | | |
|---|---|---|
| JP | 2012-253245 A | 12/2012 |
| JP | 2013-093374 A | 5/2013 |
| JP | 5282675 B2 * | 9/2013 |
| JP | 2014-138172 A | 7/2014 |
| JP | 2014-183104 A | 9/2014 |
| JP | 2017-216360 A | 12/2017 |
| JP | 2018-006781 A | 1/2018 |

\* cited by examiner

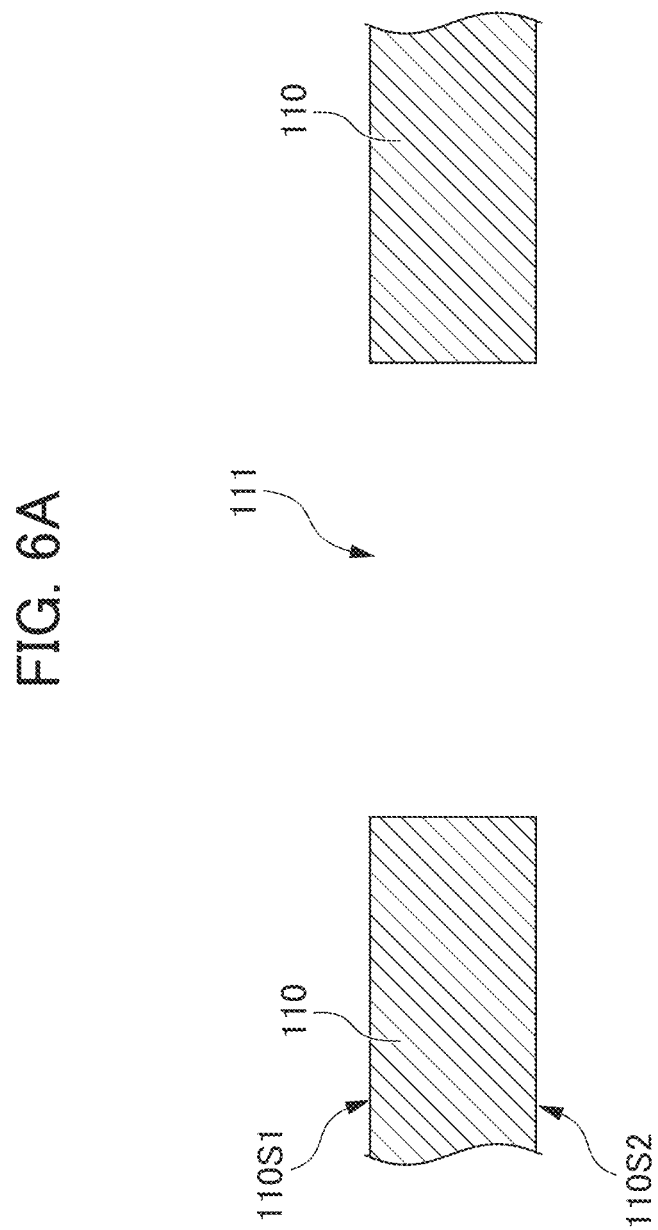

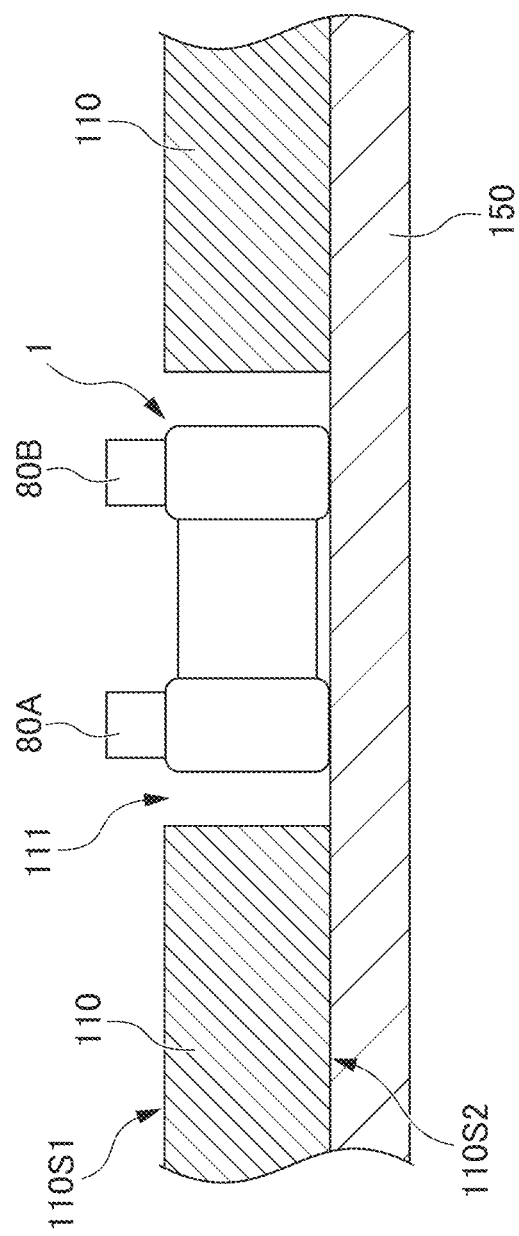

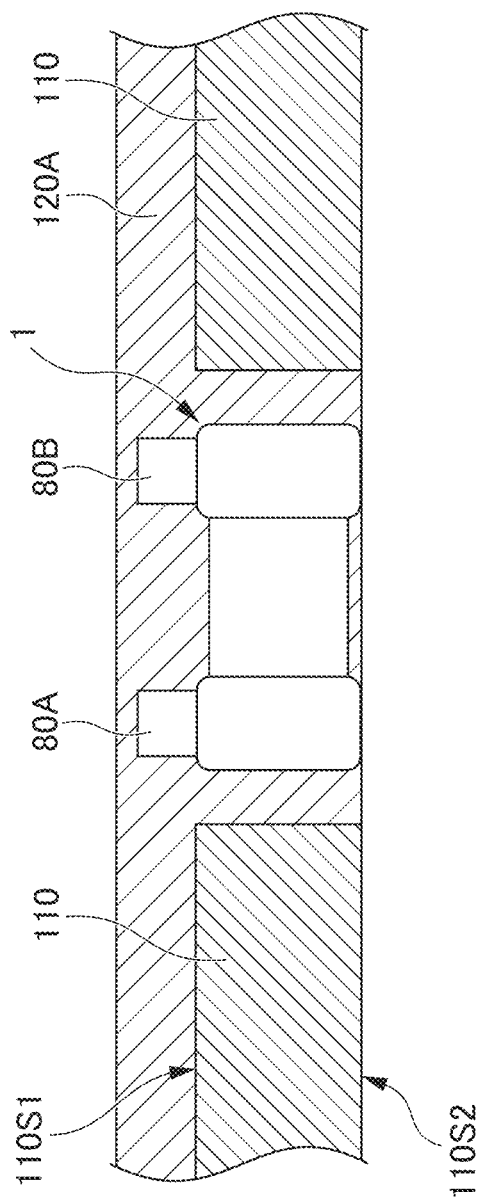

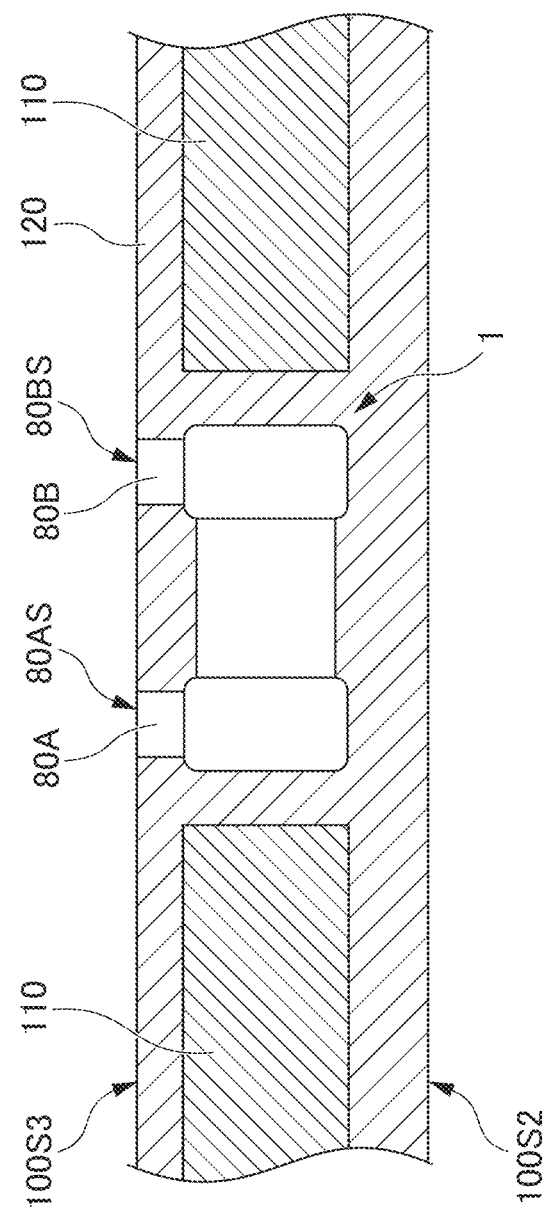

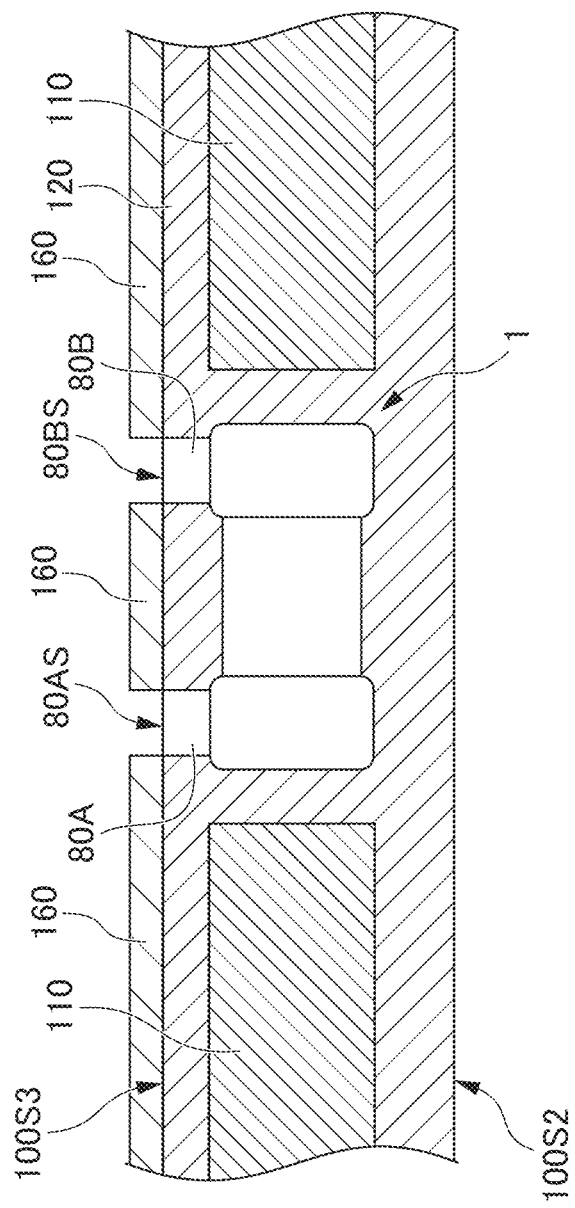

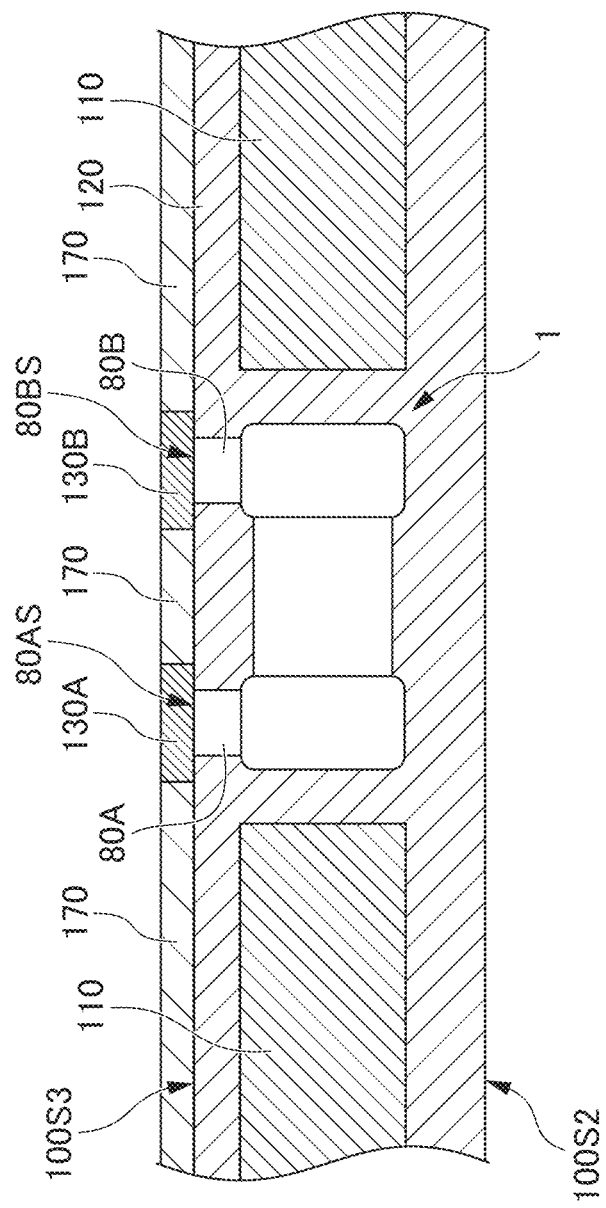

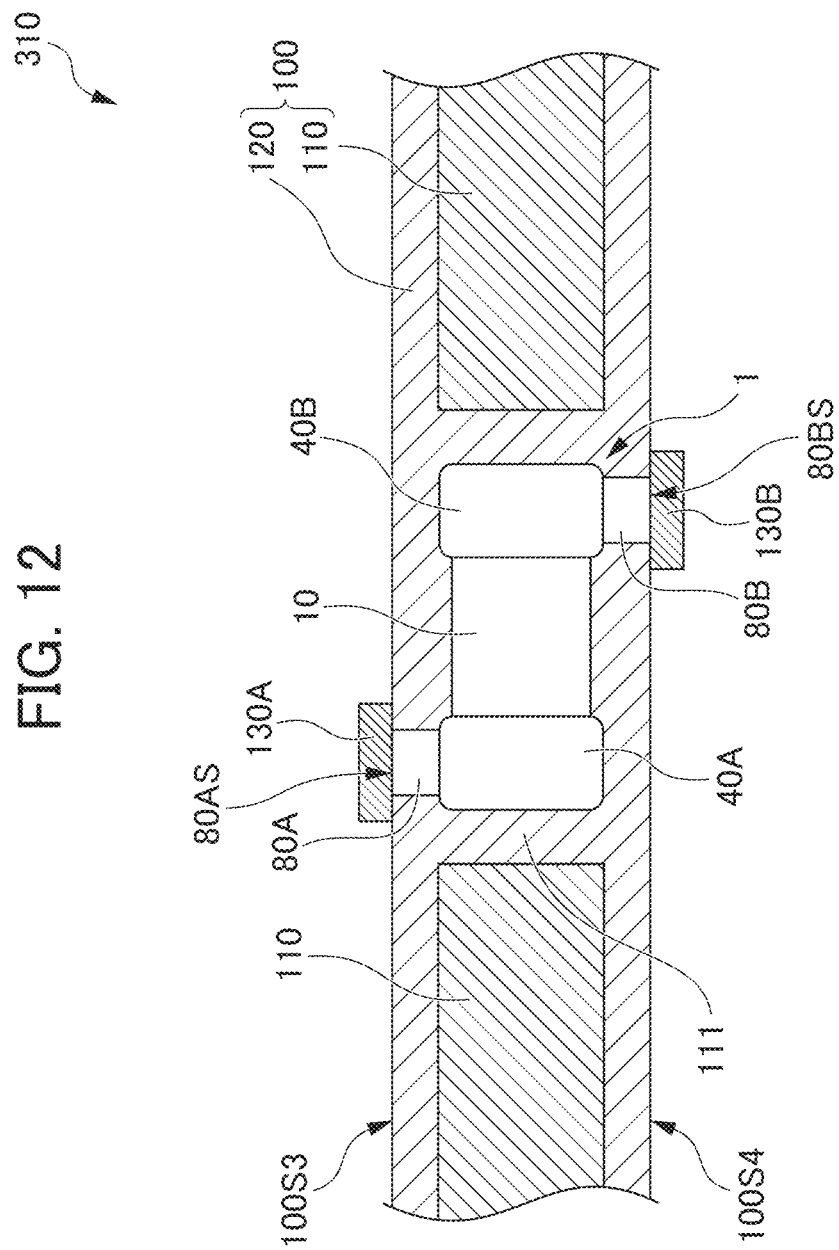

COMPONENT BUILT-IN SUBSTRATE

CROSS REFERENCE TO RELATED APPLICATIONS

This application claims the benefit of priority to Japanese Patent Application No. 2020-136632 filed on Aug. 13, 2020. The entire contents of this application are hereby incorporated herein by reference.

BACKGROUND OF THE INVENTION

1. Field of the Invention

The present invention relates to a component built-in substrate.

2. Description of the Related Art

In recent years, with the miniaturization and thinning of electronic devices such as mobile phones and portable music players, miniaturization of the wiring substrate mounted on the electronic device has been progressing. Along with this, miniaturization and thinning of the ceramic electronic component to be mounted on the substrate has also progressed. In such a situation, for example, Japanese Unexamined Patent Application Publication Nos. 2002-203735, 2014-183104, and 2014-138172 disclose a component built-in substrate in which ceramic electronic components such as capacitors, resistors, and inductors are built therein.

Regarding the ceramic electronic components disclosed in Japanese Unexamined Patent Application Publication Nos. 2002-203735, 2014-183104, and 2014-138172, if a metal oxide is present on the surface of the external electrode when the ceramic electronic component is embedded in the substrate, the connection resistance is deteriorated between the external electrode and the via hole conductor to be provided in subsequent processing. In order to prevent this, it is necessary to reduce or prevent the formation of metal oxide on the surface of the external electrode. However, in a case in which the ceramic electronic component is placed for a long time in an environment which can be in contact with moisture containing oxygen in the atmosphere or dissolved oxygen through shipping, etc., it is difficult to prevent the formation of metal oxide. Therefore, it may be difficult to reduce or prevent the deterioration of the electrical connection state between the external electrode of the electronic component and the wiring pattern of the substrate through the via hole conductor.

SUMMARY OF THE INVENTION

Preferred embodiments of the present invention provide component built-in substrates that are each able to reduce or prevent the deterioration of an electrical connection state between a wiring pattern of an external electrode and a substrate of an electronic component.

A component built-in substrate according to a preferred embodiment of the present application includes a multilayer body including a plurality of stacked ceramic layers and a plurality of stacked inner conductive layers, the multilayer body further including a first main surface and a second main surface on opposite sides of the multilayer body in a height direction, a first side surface and a second side surface on opposite sides of the multilayer body in a width direction orthogonal or substantially orthogonal to the height direction, and a first end surface and a second end surface on opposite sides of the multilayer body in a length direction orthogonal or substantially orthogonal to the height direction and the width direction; a multilayer ceramic electronic component including a first external electrode provided adjacent to or in a vicinity of the first end surface of the multilayer body and connected to the inner conductive layer, and a second external electrode provided adjacent to or in a vicinity of the second end surface of the multilayer body and connected to the inner conductive layer; and a substrate including the multilayer ceramic electronic component embedded therein, wherein the multilayer ceramic electronic component includes a first connection portion that protrudes from the first external electrode, and a second connection portion that protrudes from the second external electrode; the substrate includes a core material; the multilayer ceramic electronic component including the first connection portion and the second connection portion includes a surface covered by the core material and embedded in the substrate; the first connection portion protrudes toward a surface of the substrate, and is not exposed at the surface of the substrate; and the second connection portion protrudes toward the surface of the substrate, and is not exposed at the surface of the substrate.

A component built-in substrate according to a preferred embodiment of the present invention includes a multilayer body including a plurality of stacked ceramic layers and a plurality of stacked inner conductive layer, the multilayer body further including a first main surface and a second main surface on opposite sides of the multilayer body in a height direction, a first side surface and a second side surface on opposite sides of the multilayer body in a width direction orthogonal or substantially orthogonal to the height direction, and a first end surface and a second end surface on opposite sides of the multilayer body in a length direction orthogonal or substantially orthogonal to the height direction and the width direction; a multilayer ceramic electronic component including a first external electrode provided adjacent to or in a vicinity of the first end surface of the multilayer body and connected to the inner conductive layer, and a second external electrode provided adjacent to or in a vicinity of the second end surface of the multilayer body and connected to the inner conductive layer; and a substrate including the multilayer ceramic electronic component embedded therein, wherein the multilayer ceramic electronic component includes a first connection portion that protrudes from the first external electrode, and a second connection portion that protrudes from the second external electrode; the substrate includes a core material, a first wiring pattern that is provided on a surface of the core material, and electrically connected to the first external electrode, and a second wiring pattern that is provided on a surface of the core material, and electrically connected to the second external electrode, the multilayer ceramic electronic component including the first connection portion and the second connection portion includes a surface covered by the core material and embedded in the substrate; the first connection portion protrudes toward a surface of the substrate, and includes a first exposed surface exposed from the surface of the substrate; the second connection portion protrudes toward a surface of the substrate, and includes a second exposed surface exposed from the surface of the substrate; the first wiring pattern is on the first exposed surface; the second wiring pattern is on the second exposed surface, and a skewness of roughness curves of the first exposed surface and the second exposed surface is larger than a skewness of roughness curves of a surface of the core material continuous with the first exposed surface and a surface of the core material continuous with the second exposed surface.

According to preferred embodiments of the present invention, component built-in substrates are each able to reduce or prevent the deterioration of the electrical connection state between the wiring pattern of the external electrode and the substrate of the electronic component.

The above and other elements, features, steps, characteristics, and advantages of the present invention will become more apparent from the following detailed description of the preferred embodiments with reference to the attached drawings.

BRIEF DESCRIPTION OF THE DRAWINGS

FIG. 6A shows a manufacturing process of the component built-in substrate of the first preferred embodiment of the present invention.

FIG. 6C shows the manufacturing process of the component built-in substrate of the first preferred embodiment of the present invention.

FIG. 6E shows the manufacturing process of the component built-in substrate of the first preferred embodiment of the present invention.

FIG. 11A shows a manufacturing process of the component built-in substrate of the second preferred embodiment of the present invention.

FIG. 11B shows the manufacturing process of the component built-in substrate of the second preferred embodiment of the present invention.

FIG. 11C shows the manufacturing process of the component built-in substrate of the second preferred embodiment of the present invention.

FIG. 12 is a cross-sectional view showing a first modified example of the component built-in substrate of the second preferred embodiment of the present invention.

DETAILED DESCRIPTION OF THE PREFERRED EMBODIMENTS

First Preferred Embodiment

Figure 1:
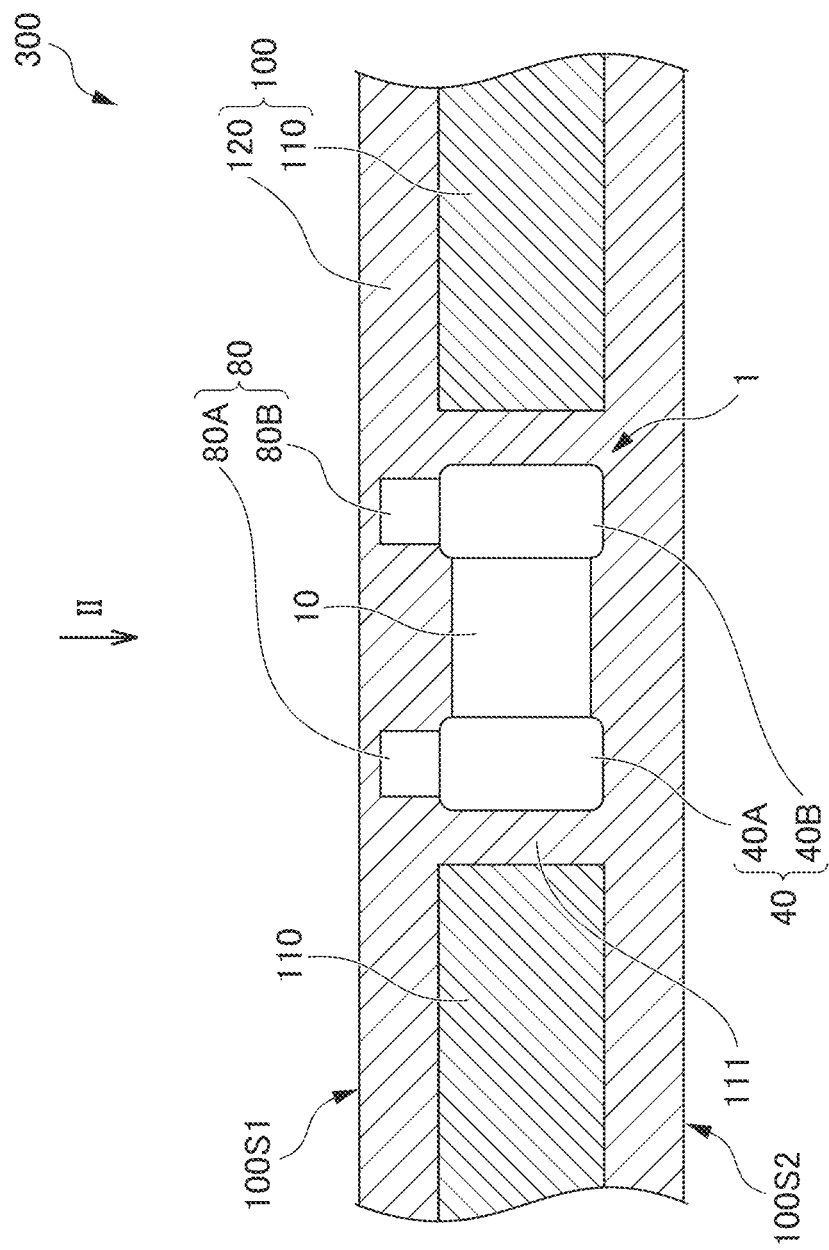
FIG. 1 is a cross-sectional view of a component built-in substrate according to a first preferred embodiment of the present invention.
Figure 2:
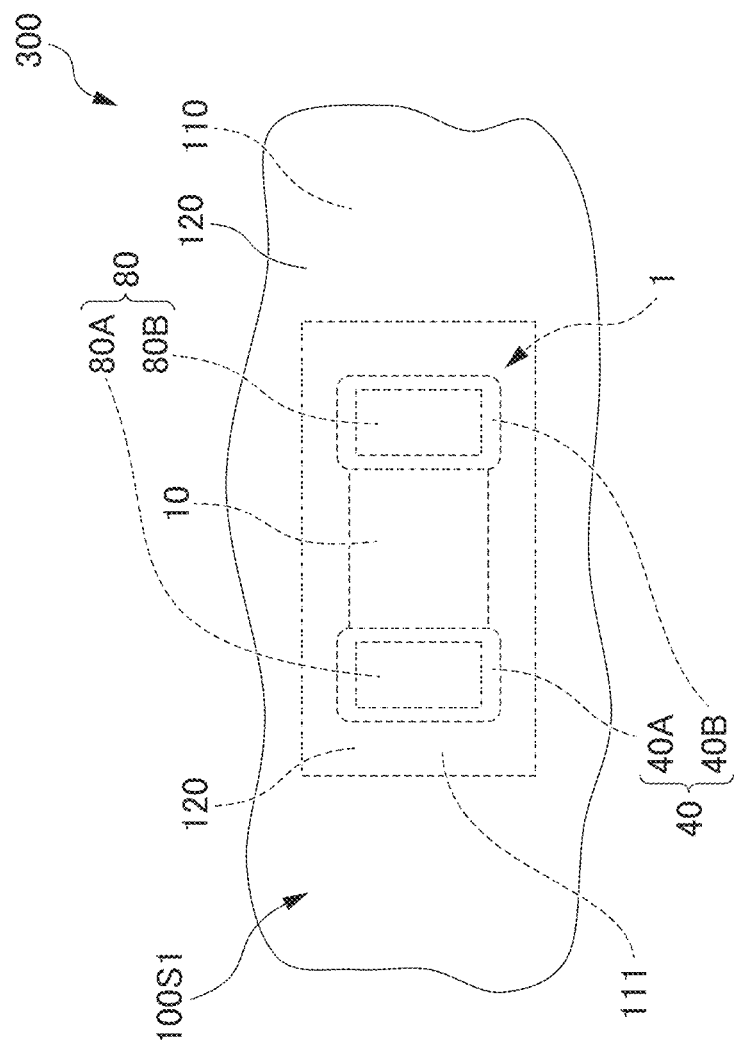
FIG. 2 is an arrow view when the component built-in substrate of FIG. 1 is viewed in the direction of the arrow II.

Hereinafter, a component built-in substrate 300 according to a first preferred embodiment of the present invention will be described. FIGS. 1 and 2 are diagrams showing the component built-in substrate 300 of the present preferred embodiment.

The component built-in substrate 300 includes a multilayer ceramic capacitor 1 as a multilayer ceramic electronic component, and a substrate 100 including the multilayer ceramic capacitor 1 therein.

FIG. 1 is a cross-sectional view of the component built-in substrate 300. However, the multilayer ceramic capacitor 1 which is embedded in the substrate 100 is not shown by a cross-sectional view but by an external view. FIG. 2 is an arrow view when the component built-in substrate 300 of FIG. 1 is viewed in the direction of the arrow II.

As shown in FIGS. 1 and 2, the multilayer ceramic capacitor 1 is embedded in the substrate 100.

Figure 3:
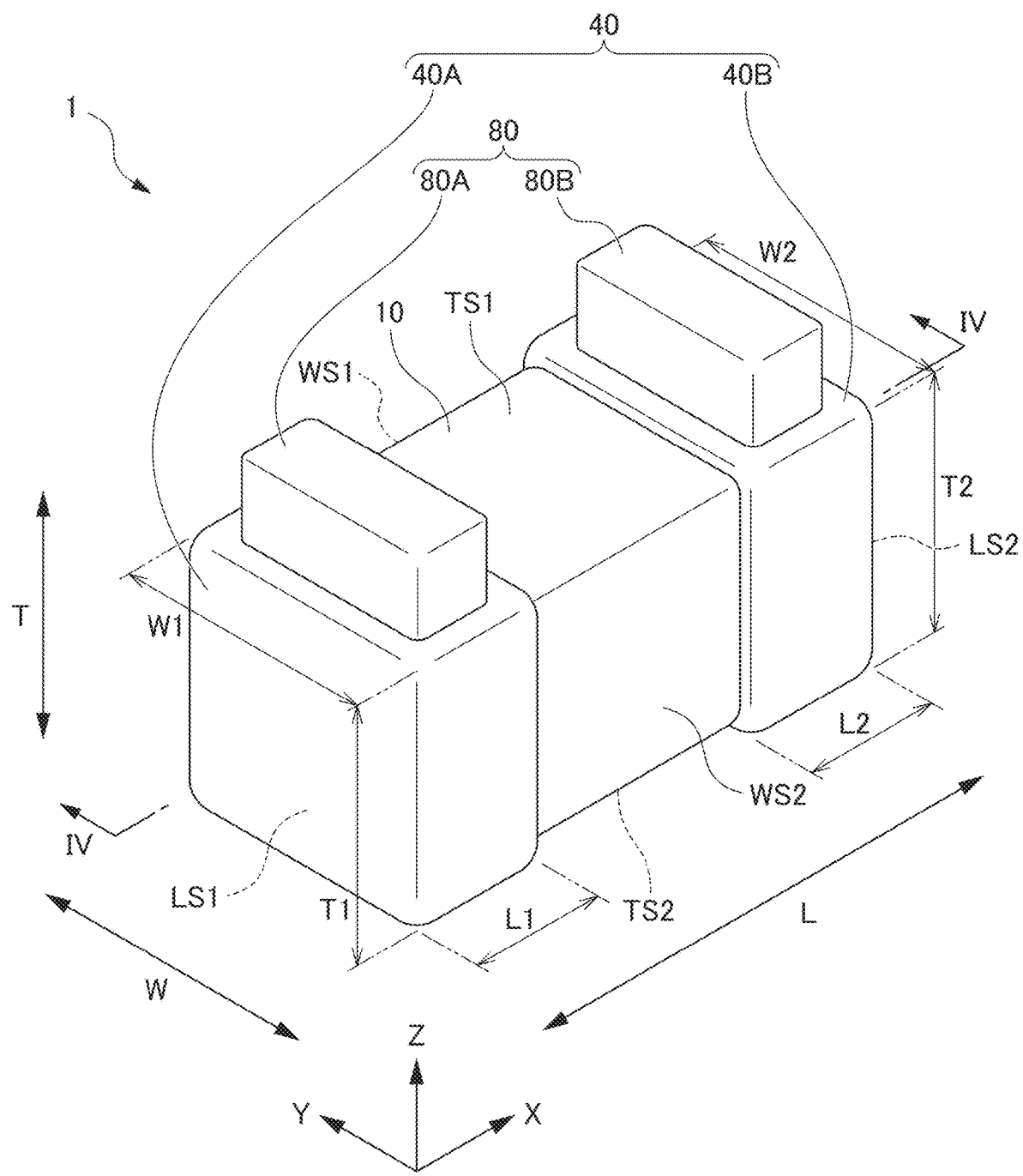
FIG. 3 is an external perspective view of a multilayer ceramic capacitor built in the component built-in substrate of the first preferred embodiment of the present invention.
Figure 4:
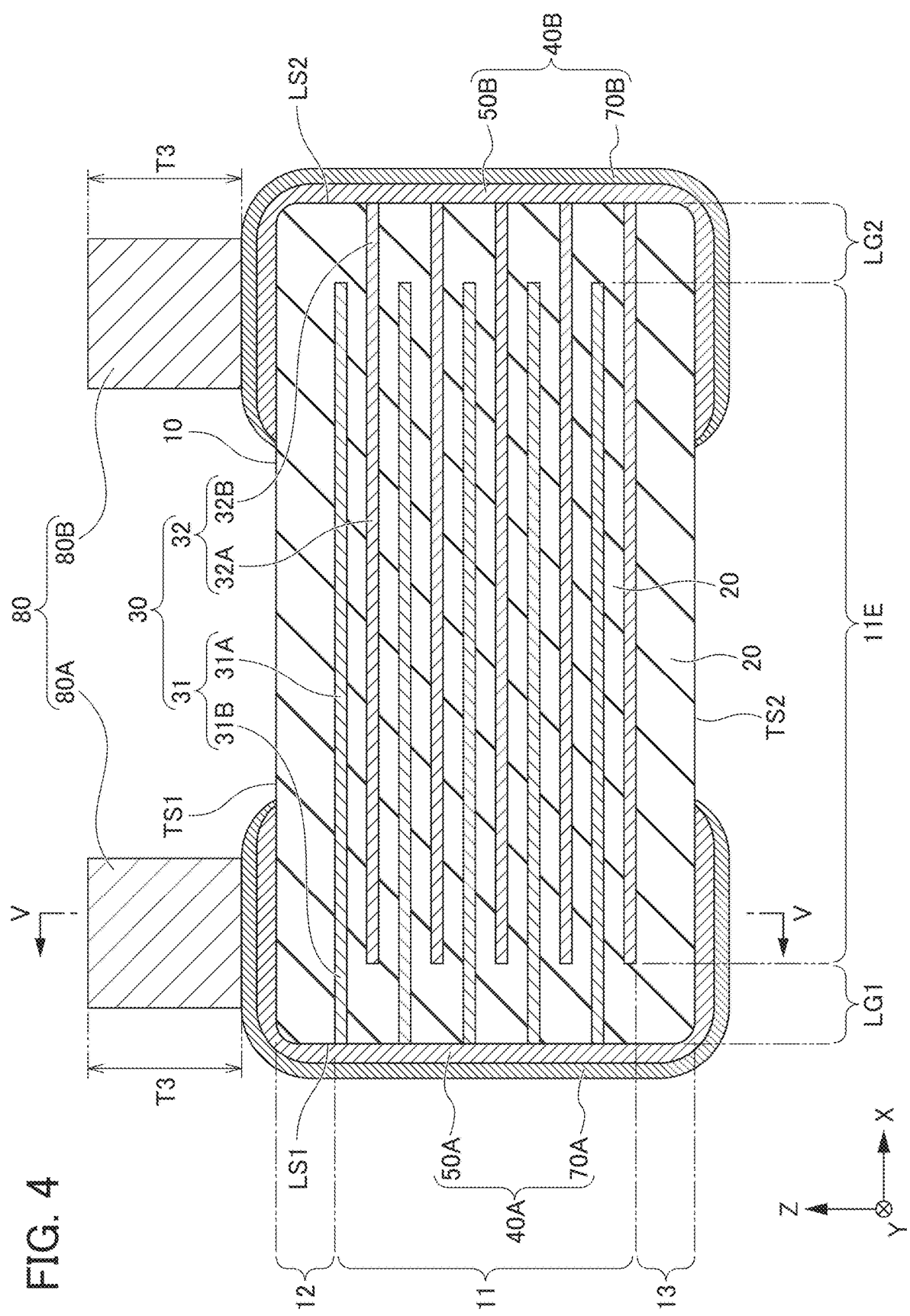
FIG. 4 is a cross-sectional view taken along the line IV-IV of the multilayer ceramic capacitor shown in FIG. 3.
Figure 5:
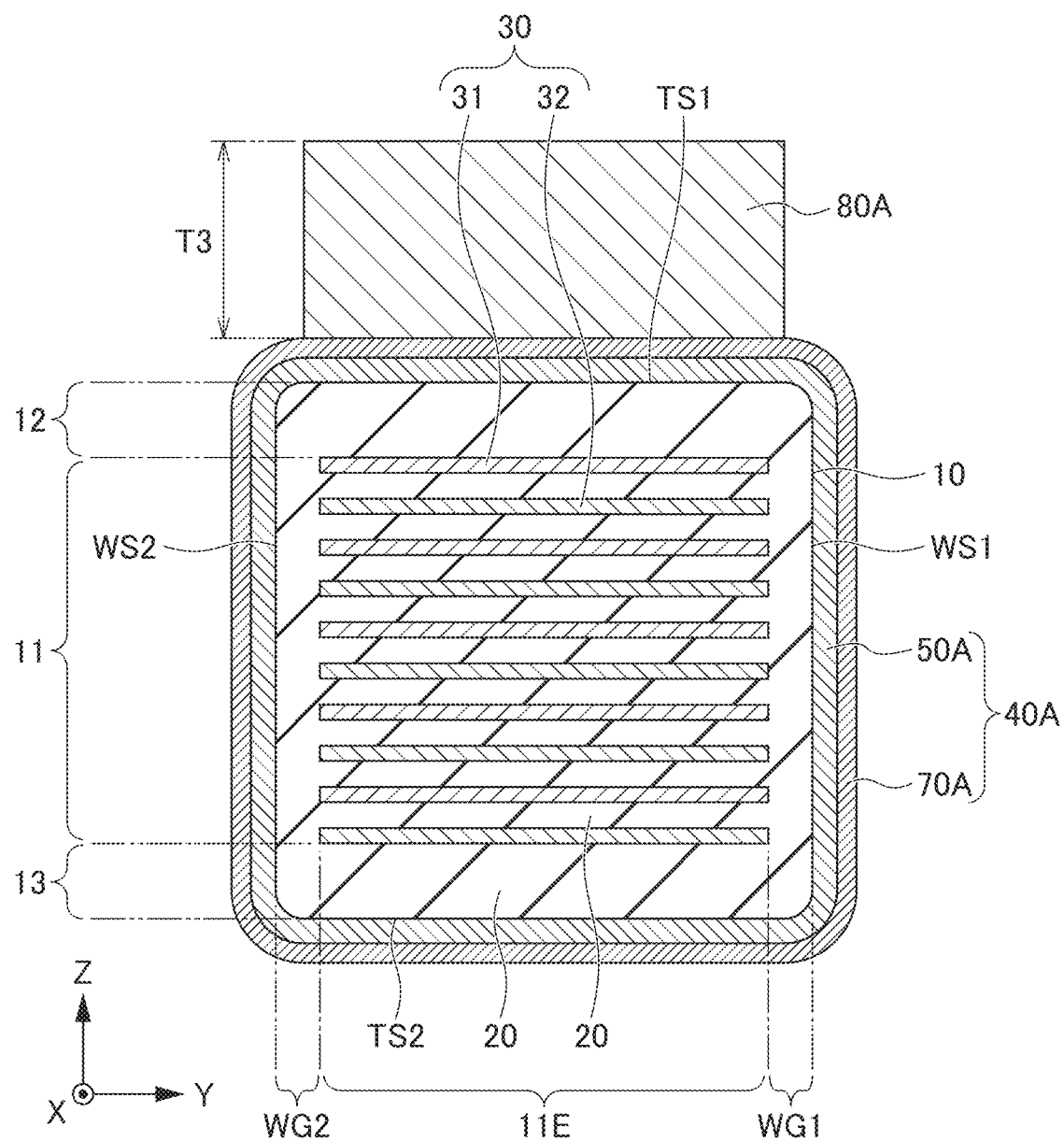
FIG. 5 is a cross-sectional view taken along the line V-V of the multilayer ceramic capacitor shown in FIG. 4.

With reference to FIGS. 3 to 5, a description will be provided of the multilayer ceramic capacitor 1 included in the substrate 100. FIG. 3 is an external perspective view showing the appearance of the multilayer ceramic capacitor 1 before being embedded in the substrate 100. FIG. 4 is a cross-sectional view taken along the line IV-IV of the multilayer ceramic capacitor 1 of FIG. 3. FIG. 5 is a cross-sectional view taken along the line V-V of the multilayer ceramic capacitor 1 of FIG. 4.

The multilayer ceramic capacitor 1 includes a multilayer body 10, an external electrode 40, and a connection portion 80 provided to protrude from the external electrode 40.

In FIGS. 3 to 5, an XYZ orthogonal coordinate system is shown. The length direction L of the multilayer ceramic capacitor 1 and the multilayer body 10 corresponds to the X direction. The width direction W of the multilayer ceramic capacitor 1 and the multilayer body 10 corresponds to the Y direction. The height direction T of the multilayer ceramic capacitor 1 and the multilayer body 10 corresponds to the Z direction. Here, the cross section shown in FIG. 4 is also referred to as an LT cross section. The cross section shown in FIG. 5 is also referred to as a WT cross section.

As shown in FIGS. 3 to 5, the multilayer body 10 includes a first main surface TS1 and a second main surface TS2 opposed to each other in the height direction T, a first side surface WS1 and a second side surface WS2 opposed to each other in the width direction W orthogonal or substantially orthogonal to the height direction T, and a first end surface LS1 and a second end surface LS2 opposed to each other in the length direction L orthogonal or substantially orthogonal to the height direction T and the width direction W.

As shown in FIG. 3, the multilayer body 10 has a substantially rectangular parallelepiped shape. The dimension in the length direction L of the multilayer body 10 is not necessarily longer than the dimension of the width direction W. The corners and ridges of the multilayer body 10 are preferably rounded, for example. The corners are portions where the three surfaces of the multilayer body intersect, and the ridges are portions where the two surfaces of the multilayer body intersect. Unevenness or the like may be provided on a portion or the entire surface defining the multilayer body 10.

The dimensions of the multilayer body 10 are not particularly limited. However, when the dimension in the length direction L of the multilayer body 10 is an L dimension, the L dimension is preferably about 0.2 mm or more and about 10 mm or less, for example. Furthermore, when the dimension in the height direction T of the multilayer body 10 is a T dimension, the T dimension is preferably about 0.1 mm or more and about 5 mm or less, for example. Furthermore, when the dimension in the width direction W of the multilayer body 10 is a W dimension, the W dimension is preferably about 0.1 mm or more and about 10 mm or less, for example.

As shown in FIGS. 4 and 5, the multilayer body 10 includes an inner layer portion 11, and a first main surface side outer layer portion 12 and a second main surface side outer layer portion 13 which sandwich the inner layer portion 11 in the height direction T.

The inner layer portion 11 includes dielectric layers 20 as a plurality of ceramic layers and internal electrode layers 30 as a plurality of inner conductive layers. In the height direction T, the inner layer portion 11 includes from the internal electrode layer 30 located closest to the first main surface TS1 to the internal electrode layer 30 located closest to the second main surface TS2. In the inner layer portion 11, the plurality of internal electrode layers 30 face each other with the dielectric layer 20 interposed therebetween. The inner layer portion 11 generates a capacitance and substantially functions as a capacitor.

The plurality of dielectric layers 20 is made of a dielectric material. The dielectric material may be, for example, a dielectric ceramic including components such as $BaTiO_3$, $CaTiO_3$, $SrTiO_3$, or $CaZrO_3$. The dielectric material may be provided by adding a secondary component, for example, an Mn compound, an Fe compound, a Cr compound, a Co compound, or a Ni compound to the main component.

The thickness of the dielectric layer 20 is preferably about 0.5 µm or more and about 10 µm or less, for example. The number of the dielectric layers 20 to be stacked is preferably 15 or more and 700 or less, for example. This number of the dielectric layers 20 is the total number of the dielectric layers of the inner layer portion 11 and the dielectric layers of the first main surface side outer layer portion 12 and the second main surface side outer layer portion 13.

The plurality of internal electrode layers 30 includes a plurality of first internal electrode layers 31 and a plurality of second internal electrode layers 32. The plurality of first internal electrode layers 31 is provided on the plurality of dielectric layers 20. The plurality of second internal electrode layers 32 is provided on the plurality of dielectric layers 20. The plurality of first internal electrode layers 31 and the plurality of second internal electrode layers 32 are embedded and alternately provided in the height direction T of the multilayer body 10.

The first internal electrode layer 31 includes a first opposing portion 31A facing the second internal electrode layer 32, and a first lead-out portion 31B drawn from the first opposing portion 31A to the first end surface LS1. The first lead-out portion 31B is exposed at the first end surface LS1.

The second internal electrode layer 32 has a second opposing portion 32A facing the first internal electrode layer 31, and a second lead-out portion 32B drawn from the second opposing portion 32A to the second end surface LS2. The second lead-out portion 32B is exposed at the second end surface LS2.

In the present preferred embodiment, the first opposing portion 31A and the second opposing portion 32A are opposed to each other with the dielectric layers 20 provided therebetween, and thus a capacitance is generated, and the characteristics of the capacitor are developed.

The shapes of the first opposing portion 31A and the second opposing portion 32A are not particularly limited; however, they have preferably a rectangular or substantially rectangular shape, for example. However, the corner portion of the rectangular shape may be rounded, or the corner portion of the rectangular shape may be formed obliquely. The shapes of the first lead-out portion 31B and the second lead-out portion 32B are not particularly limited; however, they have preferably a rectangular or substantially rectangular shape, for example. However, the corner portion of the rectangular shape may be rounded, or the corner portion of the rectangular shape may be formed obliquely.

The dimension in the width direction W of the first opposing portion 31A and the dimension in the width direction W of the first lead-out portion 31B may be provided to have the same dimension, or one of them may be provided to have a smaller dimension. The dimension in the width direction W of the second opposing portion 32A and the dimension in the width direction W of the second lead-out portion 32B may be provided to have the same dimension, or one of the dimensions may be provided to be narrower.

The first internal electrode layer 31 and the second internal electrode layer 32 are made of a suitable conductive material including a metal, for example, Ni, Cu, Ag, Pd, and Au, or an alloy including at least one of these metals. When using an alloy, the first internal electrode layer 31 and the second internal electrode layer 32 may be made of, for example, Ag—Pd alloy or the like.

The thickness of each of the first internal electrode layer 31 and the second internal electrode layer 32 is preferably, for example, about 0.2 µm or more and about 2.0 µm or less. The total number of the first internal electrode layer 31 and the second internal electrode layer 32 is preferably 15 or more and 200 or less, for example.

The first main surface side outer layer portion 12 is located adjacent to or in a vicinity of the first main surface TS1 of the multilayer body 10. The first main surface side outer layer portion 12 is an aggregate of a plurality of dielectric layers 20 as ceramic layers positioned between the first main surface TS1 and the internal electrode layer 30 closest to the first main surface TS1. The dielectric layer 20 used in the first main surface side outer layer portion 12 may be the same as the dielectric layer 20 used in the inner layer portion 11.

The second main surface side outer layer portion 13 is located adjacent to or in a vicinity of the second main surface TS2 of the multilayer body 10. The second main surface side outer layer portion 13 is an aggregate of a plurality of dielectric layers 20 as a plurality of ceramic layers positioned between the second main surface TS2 and the internal electrode layer 30 closest to the second main surface TS2. The dielectric layer 20 used in the second main surface side outer layer portion 13 may be the same as the dielectric layer 20 used in the inner layer portion 11.

The multilayer body 10 has a counter electrode portion 11E. The counter electrode portion 11E is a portion where the first opposing portion 31A of the first internal electrode layer and the second opposing portion 32A of the second internal electrode layer 32 face each other. The counter electrode portion 11E is a portion of the inner layer portion 11. FIG. 4 illustrates the range in the length direction L of the counter electrode portion 11E. FIG. 5 illustrates the range in the width direction W of the counter electrode portion 11E. The counter electrode portion 11E is also referred to as a capacitor effective portion.

The multilayer body 10 includes side surface-side outer layer portions WG. The side surface-side outer layer portions WG include a first side surface-side outer layer portion WG1 and a second side surface-side outer layer portion WG2. The first side surface-side outer layer portion WG1 includes the dielectric layer 20 located between the counter electrode portion 11E and the first side surface WS1. The second side surface-side outer layer portion WG2 includes the dielectric layer 20 located between the counter electrode portion 11E and the second side surface WS2. FIG. 5 shows the ranges in the width direction W of the first side surface-side outer layer portion WG1 and the second side surface-side outer layer portion WG2. The side surface-side outer layer portions WG are each also referred to as a W gap or a side gap.

The multilayer body 10 includes end surface-side outer layer portions LG. The end surface-side outer layer portions LG include a first end surface-side outer layer portion LG1 and a second end surface-side outer layer portion LG2. The first end surface-side outer layer portion LG1 includes the dielectric layer 20 located between the counter electrode portion 11E and the first end surface LS1. The second end surface-side outer layer portion LG2 includes the dielectric layer 20 located between the counter electrode portion 11E and the second end surface LS2. FIG. 4 shows the ranges in the length directions L of the first end surface-side outer layer portion LG1 and the second end surface-side outer layer portion LG2. The end surface-side outer layer portion LG is also referred to as an L gap or end gap.

The external electrode 40 includes a first external electrode 40A and a second external electrode 40B.

The first external electrode 40A is provided adjacent to or in a vicinity of the first end surface LS1. The first external electrode 40A is connected to the first internal electrode layer 31. The first external electrode 40A is provided on the first end surface LS1. However, in addition to the first end surface LS1, the first external electrode 40A may be provided on at least one of the first main surface TS1, the second main surface TS2, the first side surface WS1, and the second side surface WS2. In the present preferred embodiment, the first external electrode 40A is provided on a portion of the first main surface TS1, a portion of the second main surface TS2, a portion of the first side surface WS1, and a portion of the second side surface WS2, in addition to the first end surface LS1. Accordingly, a first connection portion 80A (described below) is able to protrude from each surface on which the first external electrodes 40A are provided. Furthermore, using the via hole conductor (not shown), the wiring pattern (not shown) is able to be connected to the first external electrode 40A from the upper and lower surfaces of the substrate 100. In addition, an impedance reduction effect is able to be provided. The first external electrodes 40A may be provided, for example, from the first end surface LS1 to either the first main surface TS1 or the second main surface TS2. In other words, the cross-sectional shape of the first external electrode 40A may have an L shape (not shown).

In a case in which the first external electrode 40A is also provided on at least one of the first main surface TS1, the second main surface TS2, the first side surface WS1, and the second side surface WS2, it is preferable, for example, that the length L1 of the first external electrode 40A provided on this portion in the length direction L is about 20% or more and about 40% or less (for example, about 200 μm or more and about 400 μm or less) of the L dimension of the multilayer body.

Furthermore, in a case in which the first external electrode 40A is provided on at least one of the first main surface TS1 or the second main surface TS2, it is preferable, for example, that the length W1 in the width direction W of the first external electrode 40A provided on this portion is equal or substantially equal to the W dimension of the multilayer body 10 (for example, about 0.1 mm or more and about 10 mm or less). Furthermore, in a case in which the first external electrode 40A is provided on at least one of the first side surface WS1 or the second side surface WS2, it is preferable, for example, that the length T1 in the height direction T of the first external electrode 40A provided on this portion is equal or substantially equal to the T dimension of the multilayer body 10 (for example, about 0.1 mm or more and about 5 mm or less).

The second external electrode 40B is provided on the second end surface LS2. The second external electrode 40B is connected to the second internal electrode layer 32. The second external electrode 40B is provided on the second end surface LS2; however, the second external electrode 40B may be provided on at least one of the first main surface TS1, the second main surface TS2, the first side surface WS1, and the second side surface WS2, in addition to the second end surface LS2. In the present preferred embodiment, the second external electrode 40B is provided on a portion of the first main surface TS1, a portion of the second main surface TS2, a portion of the first side surface WS1, and a portion of the second side surface WS2, in addition to the second end surface LS2. Accordingly, the second connection portion 80B described below is able to protrude from each surface on which the second external electrode 40B is provided. Furthermore, using a via hole conductor (not shown), the wiring pattern (not shown) is able to be connected to the second external electrode 40B from the upper and lower surfaces of the substrate 100. In addition, an impedance reduction effect is able to be provided. The second external electrodes 40B may be provided, for example, from the second end surface LS2 to either the first main surface TS1 or the second main surface TS2. In other words, the cross-sectional shape of the second external electrodes 40B may have an L shape (not shown).

In a case in which the second external electrode 40B is also provided on at least one of the first main surface TS1, the second main surface TS2, the first side surface WS1, and the second side surface WS2, it is preferable, for example, that the length L1 in the length direction L of the second external electrode 40B provided on this portion is about 20% or more and about 40% or less (for example, about 200 μm or more and about 400 μm or less) of the L dimension of the multilayer body.

Furthermore, in a case in which the second external electrode 40B is provided on at least one of the first main surface TS1 or the second main surface TS2, it is preferable, for example, that the length W2 in the width direction of the second external electrode 40B provided on this portion is equal or substantially equal to the W dimension of the multilayer body 10 (for example, about 0.1 mm or more and about 10 mm or less). Furthermore, in a case in which the second external electrode 40B is provided on at least one of the first side surface WS1 or the second side surface WS2, it is preferable, for example, that the length T2 in the height direction T of the second external electrode 40B provided on this portion is equal or substantially equal to the T dimension of the multilayer body 10 (for example, about 0.1 mm or more and about 5 mm or less).

As described above, in the multilayer body 10, the capacitance is provided by the first opposing portion 31A of the first internal electrode layer 31 and the second opposing portion 32A of the second internal electrode layer 32 facing each other with the dielectric layer 20 interposed therebetween. Therefore, the characteristics of the capacitor are developed between the first external electrode 40A to which the first internal electrode layer 31 is connected and the second external electrode 40B to which the second internal electrode layer 32 is connected.

The first external electrode 40A includes a first foundation electrode layer 50A and a first plated layer 70A provided on the first foundation electrode layer 50A.

The second external electrode 40B includes a second foundation electrode layer 50B and a second plated layer 70B provided on the second foundation electrode layer 50B.

The first foundation electrode layer 50A is provided on the first end surface LS1. The first foundation electrode layer 50A is connected to the first internal electrode layer 31. In the present preferred embodiment, the first foundation electrode layer 50A is provided to extend from the first end surface LS1 to a portion of the first main surface TS1 and a portion of the second main surface TS2, and a portion of the first side surface WS1 and a portion of the second side surface WS2.

The second foundation electrode layer 50B is provided on the second end surface LS2. The second foundation electrode layer 50B is connected to the second internal electrode layer 32. In the present preferred embodiment, the second foundation electrode layer 50B is provided to extend from the second end surface LS2 to a portion of the first main surface TS1 and a portion of the second main surface TS2, and a portion of the first side surface WS1 and a portion of the second side surface WS2.

In the present preferred embodiment, the first foundation electrode layer 50A and the second foundation electrode layer 50B are fired layers. It is preferable, for example, that the fired layers each include both a metal component, and either a glass component or a ceramic component or both the glass component and the ceramic component. The metal component includes, for example, at least one selected from Cu, Ni, Ag, Pd, Ag—Pd alloys, Au, and the like. The glass component includes, for example, at least one selected from B, Si, Ba, Mg, Al, Li, and the like. As the ceramic component, a ceramic material of the same kind as that of the dielectric layer 20 may be used, or a ceramic material of a different kind may be used. The ceramic component includes, for example, at least one selected from $BaTiO_3$, $CaTiO_3$, $(Ba, Ca)TiO_3$, $SrTiO_3$, $CaZrO_3$ and the like.

The fired layer is provided by, for example, applying a conductive paste including glass and metal to a multilayer body and firing it. The fired layer may be provided by simultaneously firing a laminated chip including an internal electrode layer and a dielectric layer and a conductive paste applied to the laminated chip, or may be provided by firing the laminated chip including the internal electrode layer and the dielectric layer to provide a multilayer body, followed by applying the conductive paste to the multilayer body and firing it. In a case of simultaneously firing the laminated chip including the internal electrode layer and the dielectric layer, it is preferable, for example, that the fired layer be formed by firing a material to which a ceramic material instead of glass component is added. In this case, it is particularly preferable, for example, to use the same type of ceramic material as the dielectric layer 20 as the ceramic material to be added. Furthermore, the fired layer may include a plurality of layers.

The thickness in the length direction of the first foundation electrode layer 50A located on the first end surface LS1 is preferably, for example, about 15 μm or more and about 160 μm or less in the central portion in the height direction T and the width direction W of the first foundation electrode layer 50A.

The thickness in the length direction of the second foundation electrode layer 50B located on the second end surface LS2 is preferably, for example, about 15 μm or more and about 160 μm or less in the central portion in the height direction T and the width direction W of the second foundation electrode layer 50B.

In a case of providing the first foundation electrode layer 50A on at least a portion of the first main surface TS1 or the second main surface TS2, the thickness in the height direction of the first foundation electrode layer 50A provided in this portion is, for example, preferably about 5 μm or more and about 40 μm or less in the central portion in the length direction L and the width direction W of the first foundation electrode layer 50A provided in this portion.

In a case of providing the first foundation electrode layer 50A on at least a portion of the first side surface WS1 or the second side surface WS2, the thickness in the width direction of the first foundation electrode layer 50A provided in this portion is preferably, for example, about 5 μm or more and about 40 μm or less in the central portion in the length direction L and the height direction T of the first foundation electrode layer 50A provided in this portion.

In a case of providing the second foundation electrode layer 50B on at least a portion of the first main surface TS1 or the second main surface TS2, the thickness in the height direction of the second foundation electrode layer 50B provided in this portion is preferably, for example, about 5 μm or more about 40 μm or less in the central portion in the length direction L and the width direction W of the second foundation electrode layer 50B provided in this portion.

In a case of providing the second foundation electrode layer 50B on at least a portion of the first side surface WS1 or the second side surface WS2, the thickness in the width direction of the second foundation electrode layer 50B provided in this portion is preferably, for example, about 5 μm or more and about 40 μm or less in the central portion in the length direction L and the height direction T of the second foundation electrode layer 50B provided in this portion.

Alternatively, the first plated layer 70A and the second plated layer 70B (described below) may be directly provided on the multilayer body 10 without providing the first foundation electrode layer 50A and the second foundation electrode layer 50B.

The first foundation electrode layer 50A and the second foundation electrode layer 50B are not limited to the fired layer, and each may be a thin film layer. The thin film layer is a layer which is formed by a thin film forming method, for example, a sputtering method or a vapor deposition method, and in which metal particles are deposited. The thin film layer preferably includes, for example, at least one metal selected from the group consisting of Mg, Al, Ti, W, Cr, Cu, Ni, Ag, Co, Mo, and V. Thus, the adhesion of the external electrode 40 to the multilayer body 10 is able to be increased. The thin film layer may be a single layer or may be provided as a plurality of layers. For example, the thin film layer may include a two-layer structure of a layer of NiCr and a layer of NiCu.

In a case of forming the thin film layer as a foundation electrode by a sputtering electrode by a sputtering method, the sputtering electrode is preferably provided in a portion of the first main surface TS1 and the second main surface TS2 of the multilayer body 10, for example. The sputtering electrode preferably includes at least one metal selected from Ni, Cr, Cu, and the like, for example. The thickness of the sputtering electrode is preferably about 50 nm or more and about 400 nm or less, and more preferably about 50 nm or more and about 130 nm or less, for example.

As the foundation electrode layer, the sputtering electrode may be provided in a portion of the first main surface TS1 and the second main surface TS2 of the multilayer body 10, while a fired layer may be provided on the first end surface LS1 and the second end surface LS2. Alternatively, the plated layer (described below) may be provided directly on the multilayer body 10 without providing the foundation electrode layer on the first end surface LS1 and the second end surface LS2. In a case of providing the fired layer on the first end surface LS1 and the second end surface LS2, the fired layer may be provided to extend not only on the first end surface LS1 and the second end surface LS2, but also on a portion of the first main surface TS1 and a portion of the second main surface TS2. In this case, the sputtering electrode may be provided to overlap on the fired layer.

The first plated layer 70A is provided to cover the first foundation electrode layer 50A.

The second plated layer 70B is provided to cover the second foundation electrode layer 50B.

The first plated layer 70A and the second plated layer 70B each preferably include a Cu-plated layer, for example.

The Cu-plated layer preferably includes outermost surfaces of the first external electrode 40A and the second external electrode 40B, for example. Thus, for example, when the via hole conductor (not shown) is made of Cu, and the via hole conductor is connected to the first external electrode 40A and the second external electrode 40B from the upper and lower surfaces of the substrate 100, the outermost surfaces of the first external electrode 40A and the second external electrode 40B and the via hole conductor are the same kind of metal. Therefore, the connection resistance of both of the connection portions is able to be reduced.

The Cu-plated layer may include a plurality of layers. The thickness per layer of the Cu-plated layer is preferably about 2 μm or more and about 15 μm or less, for example.

The Cu-plated layer may be provided directly on the multilayer body 10 without the first foundation electrode layer 50A or the second foundation electrode layer 50B provided therebetween. In this case, the Cu-plated layer may be provided after a catalyst is provided on the surface of the multilayer body 10 as a pretreatment. Since Cu has favorable bondability with Ni, if the metal forming the internal electrode layer 30 is Ni, the adoption of Cu-plating is also suitable in terms of bondability.

When directly providing the plated layer on the multilayer body 10, the thickness of the foundation electrode layer is able to be reduced. Therefore, the reduction in the thickness of the foundation electrode layer provides the reduction in the dimension of the height direction T of the multilayer ceramic capacitor 1, and thus the height of the multilayer ceramic capacitor 1 is able to be reduced. Alternatively, the reduction in the thickness of the foundation electrode layer allows the dielectric layer 20 sandwiched between the first internal electrode layer 31 and the second internal electrode layer 32 to increase, thereby improving the elementary body thickness. Thus, by providing the plated layer directly on the multilayer body 10, the degrees of freedom in design of the multilayer ceramic capacitor are able to be improved.

The connection portion 80 includes the first connection portion 80A and the second connection portion 80B.

The first connection portion 80A is connected to the first external electrode 40A, and is provided to protrude from the first external electrode 40A. The first connection portion 80A is provided on at least one of the first main surface TS1, the second main surface TS2, the first side surface WS1, the second side surface WS2, and the first end surface LS1 on which the first external electrodes 40A exists. In the present preferred embodiment, the first connection portion 80A is provided on the first main surface TS1 via the first external electrodes 40A.

The first connection portion 80A includes a columnar portion which protrudes from the first external electrode 40A in a columnar shape in a direction away from the multilayer body 10. The first connection portion 80A protrudes from the first external electrode 40A in the height direction from the second main surface TS2 toward the first main surface TS1.

The first connection portion 80A of the present preferred embodiment has a rectangular or substantially rectangular shape in the cross section orthogonal or substantially orthogonal to the height direction T (i.e., the LW cross section). Thus, by providing a rectangular or substantially rectangular cross-sectional shape of the first connection portion 80A, the existing area of the first external electrode 40A is able to be effectively utilized in a rectangular or substantially rectangular shape present on the surface on which the first connection portion 80A is provided, and thus a columnar first connection portion 80A having a large cross-sectional area is able to be provided. Therefore, the contact area between the first connection portion 80A and the wiring pattern of the substrate 100 to be connected later is able to be increased (not shown in FIGS. 1 and 2. Refer to the wiring pattern 130 in FIGS. 9 and 10 of the second preferred embodiment.), and thus the electrical connection state is able to be improved. The rectangular shape referred to herein includes a rectangular shape having a rounded corner or a substantially rectangular shape of which a corner is formed obliquely. The cross-sectional shape of the first connection portion 80A is not limited to a rectangular or substantially rectangular shape, and may be another polygonal shape. Thus, by effectively utilizing the existing area of the first external electrode 40A in the substantially rectangular shape present on the surface where the first connection portion 80A is provided, the columnar first connection portion 80A having a large cross-sectional area is able to be provided. The cross-sectional shape of the first connection portion 80A is not limited to a polygonal shape, and may be, for example, a circular shape or the like. Furthermore, the first connection portion 80A is not limited to a columnar portion in which the cross-sectional area of the LW cross section is constant or substantially constant at all times, and may be a columnar portion such as a truncated pyramid, for example.

The second connection portion 80B is connected to the second external electrode 40B, and is provided to protrude from the second external electrode 40B. The second connection portion 80B is provided on at least one of the first main surface TS1, the second main surface TS2, the first side surface WS1, the second side surface WS2, and the first end surface LS1 on which the second external electrodes 40B exists. In the present preferred embodiment, the second connection portion 80B is provided on the first main surface TS1 via the second external electrodes 40B.

The second connection portion 80B includes a columnar portion which protrudes from the second external electrode 40B in a columnar shape in a direction away from the multilayer body 10. The second connection portion 80B protrudes from the second external electrode 40B in the height direction from the second main surface TS2 toward the first main surface TS1.

The second connection portion 80B of the present preferred embodiment has a rectangular or substantially rectangular shape in the cross section orthogonal or substantially orthogonal to the height direction T (i.e., the LW cross section). Thus, by providing a rectangular or substantially rectangular cross-sectional shape of the second connection portion 80B, the existing area of the second external electrode 40B is able to be effectively utilized in the substantially rectangular shape present on the surface on which the second connection portion 80B is provided, and thus a columnar second connection portion 80B having a large cross-sectional area is able to be provided. Therefore, the contact area between the second connection portion 80B and the wiring pattern of the substrate 100 to be connected later is able to be increased (not shown in FIGS. 1 and 2. Refer to the wiring pattern 130 in FIGS. 9 and 10 of the second preferred embodiment.), and thus the electrical connection state is able to be improved. The rectangular shape referred to herein includes a rectangular shape having a rounded corner or a substantially rectangular shape of which a corner is formed obliquely. The cross-sectional shape of the second connection portion 80B is not limited to a rectangular or substantially rectangular shape, and may be another polygonal shape. Thus, by effectively utilizing the existing area of the second external electrode 40B in the rectangular or substantially rectangular shape present on the surface where the second connection portion 80B is provided, the columnar second connection portion 80B having a large cross-sectional area is able to be provided. The cross-sectional shape of the second connection portion 80B is not limited to a polygonal shape, and may be, for example, a circular shape or the like. Furthermore, the second connection portion 80B is not limited to a columnar portion in which the cross-sectional area of the LW cross section is constant or substantially constant at all times, and may be a columnar portion such as a truncated pyramid, for example.

The size of the cross-sectional area when the first connection portion 80A or the second connection portion 80B is cut in a direction orthogonal or substantially orthogonal to the protruding direction (i.e., the size of the LW cross-section in the present preferred embodiment) is not particularly limited. However, it is preferable that the cross-sectional areas of the first connection portion 80A and the second connection portion 80B each fall within a predetermined range, for example.

More specifically, when the first connection portion 80A is provided on at least one of the first main surface TS1 or the second main surface TS2, if the length in the length direction of the first external electrode 40A of the surface on which the first connection portion 80A is provided is referred to as L1, and the length in the width direction of the first external electrode 40A of the surface on which the first connection portion 80A is provided is referred to as W1, the cross-sectional area A1 of the first connection portion 80A preferably satisfies the below expression (1), for example. Furthermore, when the second connection portion 80B is provided on at least one of the first main surface TS1 or the second main surface TS2, if the length in the length direction of the second external electrode 40B of the surface on which the second connection portion 80B is provided is referred to as L2, and the length in the width direction of the second external electrode 40B of the surface on which the second connection portion 80B is provided is referred to as W2, the cross-sectional area B1 of the second connection portion 80B preferably satisfies the below expression (2), for example. Accordingly, the contact area between the first connection portion 80A and the second connection portion 80B, and the wiring pattern of the substrate 100 to be connected later (refer to FIGS. 9 and 10) are able to be provided, and the adhesion force and the connection stability are able to be significantly improved.

$$(L1 \times 0.03) \times (W1 \times 0.03) \leq A1 \leq L1 \times W1 \tag{1}$$

$$(L2 \times 0.03) \times (W2 \times 0.03) \leq B1 \leq L2 \times W2 \tag{2}$$

If the expressions (1) and (2) are expressed by the expressions (1B) and (2B) as described below, the value of $\alpha$ may be 0.03. However, the value of $\alpha$ is preferably about 0.2, and more preferably about 0.5, for example. Accordingly, the adhesion force and the connection stability is able to be further improved. Furthermore, when the value of $\alpha$ is about 0.7, an area of about half or more of the area of the external electrode 40 is able to be effectively utilized on the surface on which the connection portion 80 is provided. Therefore, the adhesion force and the connection stability is able to be further improved.

$$(L1 \times \alpha) \times (W1 \times \alpha) \leq A1 \leq L1 \times W1 \tag{1B}$$

$$(L2 \times \alpha) \times (W2 \times \alpha) \leq B1 \leq L2 \times W2 \tag{2B}$$

When the first connection portion 80A is provided on at least one of the first side surface WS1 or the second side surface WS2, if the length in the length direction of the first external electrode 40A of the surface on which the first connection portion 80A is provided is referred to as L1, and the length in the height direction of the first external electrode 40A of the surface on which the first connection portion 80A is provided is referred to as T1, the cross-sectional area A1 of the first connection portion 80A preferably satisfies the below expression (3), for example. Furthermore, when the second connection portion 80B is provided on at least one of the first side surface WS1 or the second side surface WS2, if the length in the length direction of the second external electrode 40B of the surface on which the second connection portion 80B is provided is referred to as L2, and the length in the height direction of the second external electrode 40B of the surface on which the second connection portion 80B is provided is referred to as T2, the cross-sectional area B1 of the second connection portion 80B preferably satisfies the below expression (4), for example. Accordingly, the contact area between the first connection portion 80A and the second connection portion 80B, and the wiring pattern of the substrate 100 to be connected later (refer to FIGS. 9 and 10) are able to be provided, and the adhesion force and the connection stability are able to be significantly improved.

$$(L1\times0.03)\times(T1\times0.03)\leq A1\leq L1\times T1 \quad (3)$$

$$(L2\times0.03)\times(T2\times0.03)\leq B1\leq L2\times T2 \quad (4)$$

If the expressions (3) and (4) are expressed by the expressions (3B) and (4B) as described below, the value of α may be 0.03. However, the value of α is preferably about 0.2, and more preferably about 0.5, for example. Accordingly, the adhesion force and the connection stability is able to be further improved. Furthermore, when the value of α is about 0.7, an area of about half or more of the area of the external electrode 40 is able to be effectively utilized on the surface on which the connection portion 80 is provided. Therefore, the adhesion force and the connection stability is able to be further improved.

$$(L1\times\alpha)\times(T1\times\alpha)\leq A1\leq L1\times T1 \quad (3B)$$

$$(L2\times\alpha)\times(T2\times\alpha)\leq B1\leq L2\times T2 \quad (4B)$$

When the cross-sectional area A1 of the first connection portion 80A varies in its protruding direction, the average cross-sectional area across the entire length in the protruding direction of the first connection portion 80A is assumed as the cross-sectional area A1. Furthermore, when the cross-sectional area B1 of the second connection portion 80B varies in its protruding direction, the average cross-sectional area across the entire length in the protruding direction of the second connection portion 80B is assumed as the cross-sectional area B1.

The lengths T3 of the first connection portion 80A and the second connection portion 80B in the protruding direction are not particularly limited. However, it is preferable, for example, that the length T3 of the first connection portion 80A and the second connection portion 80B in the protruding direction be shorter than the length in the height direction T connecting the first main surface TS1 and the second main surface TS2 of the multilayer body 10 (i.e., the T dimension of the multilayer body 10). Accordingly, the first connection portion 80A and the second connection portion 80B are able to be significantly reduced or prevented from being damaged by the effect of an external force. The length T3 of the first connection portion 80A and the second connection portion 80B in the protruding direction is preferably, for example, about 60% or less, preferably about 40% or less of the length in the height direction T connecting the first main surface TS1 and the second main surface TS2 of the multilayer body 10, and is preferably, for example, about 300 μm or less, preferably about 200 μm or less.

Furthermore, it is preferable, for example, that the length T3 of the first connection portion 80A in the protruding directions is longer than the thickness of the first external electrodes 40A in which the first connection portions 80A is provided. The length T3 in the protruding direction of the second connection portion 80B is preferably longer than the thickness of the second external electrodes 40B on which the second connection portion 80B is provided, for example. Thus, it is easy to connect the first connection portion 80A and the second connection portion 80B with the wiring pattern of the substrate 100 (refer to FIGS. 9 and 10). Furthermore, the degrees of freedom of the embedded position of the multilayer ceramic capacitor 1 with respect to the substrate 100 are able to be increased. The length T3 in the protruding direction of the first connection portion 80A and the second connection portion 80B is, for example, preferably about 20% or more, preferably about 30% or more of the length in the height direction T connecting the first main surface TS1 and the second main surface TS2 of the multilayer body 10, and is preferably about 100 μm or more, preferably about 150 μm or more, for example.

The number of the first connection portions 80A and the number of the second connection portions 80B may be singular or plural. In the present preferred embodiment, a single first connection portion 80A and a single second connection portion 80B are provided. With a single first connection portion 80A and a single second connection portion 80B, the multilayer ceramic capacitor 1 is able to be provided with a simple structure. In a case in which a plurality of first connection portions 80A and a plurality of second connection portions 80B are provided, the plurality of first connection portions 80A and the plurality of second connection portions 80B may be provided on one surface of the multilayer body 10. Accordingly, the number of electrically connecting points between the first connection portion 80A and the second connection portion 80B and the wiring pattern of the substrate 100 is able to be increased, and thus, the occurrence of connection failure is able to be reduced or prevented. In addition, one or a plurality of first connection portions 80A and one or a plurality of second connection portions 80B may be provided on the respective surfaces of the multilayer body 10. Accordingly, for example, the upper and lower surfaces of the substrate 100 are able to be utilized to wire, and thus, the degrees of freedom in the structure of the wiring pattern of the substrate 100 are able to be increased.

The metal included in the first connection portion 80A and the second connection portion 80B preferably has a low-resistance and high-thermal conductivity, for example. For example, a metal having a lower resistivity than that of the metal included in the internal electrode layer 30 may be used. More specifically, in a case in which the metal included in the internal electrode layer 30 is Ni, Cu may be used as the metal included in the first connection portion 80A and the second connection portion 80B. The material of at least the outermost surfaces of the first connection portion 80A and the second connection portion 80B is preferably Cu, for example.

In the present preferred embodiment, Cu is used as a metal included in the first connection portion 80A and the second connection portion 80B. Thus, for example, when forming a wiring pattern (refer to FIGS. 9 and 10) with Cu, the first connection portion 80A and the second connection portion 80B, and the wiring pattern are the same kind of metal. Therefore, the connection resistance of their connection portions is reduced, and thus, deterioration of the substrate characteristics is able to be reduced or prevented. Furthermore, for example, when forming the outermost surfaces of the first external electrode 40A and the second external electrode 40B with Cu, the first connection portion 80A and the second connection portion 80B, the outermost surfaces of the first external electrode 40A and the second external electrode 40B are the same kind of metal. Therefore, the connection resistance of their connection portions is reduced, and thus, deterioration of the substrate characteristics is able to be reduced or prevented. Furthermore, Cu is relatively low in cost and excellent in mass productivity. Therefore, Cu is also preferable in these respects. However, the metal included in the first connection portion 80A and the second connection portion 80B is not limited to Cu, and may be, for example, a metal such as Au and Pt.

As shown in FIGS. 1 and 2, the substrate 100 includes the multilayer ceramic capacitor 1 embedded therein. As shown in FIG. 1, the substrate 100 includes a first front surface 100S1 and a second front surface 100S2 which is a back surface thereof. In FIG. 2, since the multilayer ceramic capacitor 1 is covered by the substrate 100, the multilayer ceramic capacitor 1 is shown by a broken line.

The substrate 100 includes a core material including a resin as a main component. The core material included in the substrate 100 includes a first core material 110 and a second core material 120.

The first core material 110 includes a cavity 111. The multilayer ceramic capacitor 1 is provided in the cavity 111 of the first core material 110.

The second core material 120 is provided to cover the surface of the multilayer ceramic capacitor 1 including the first connection portion 80A and the second connection portion 80B. Furthermore, the second core material 120 is provided to sandwich the first core material 110.

The first connection portion 80A and the second connection portion 80B of the multilayer ceramic capacitor 1 protrude toward the first front surface 100S1 of the substrate 100; however, they are completely covered by the second core material 120 including their protruding portions. Therefore, the first connection portion 80A and the second connection portion 80B of the multilayer ceramic capacitor 1 are not exposed on the surface of the substrate 100.

The core material included in the substrate 100 has a thickness that is able to completely cover the multilayer ceramic capacitor 1 including at least the first connection portion 80A and the second connection portion 80B. The core material included in the substrate 100 has a thickness of preferably, for example, about 0.1 mm or more and about 1.6 mm or less.

The substrate 100 preferably includes a stack of a plurality of core materials, for example. The first core material 110 and the second core material 120 as a plurality of core materials may be of the same material. The first core material 110 and the second core material 120 are charged at different timings in the manufacturing process described below.

The first core material 110 and the second core material 120 preferably include, for example, a material provided by blending a glass epoxy resin, a polyimide resin, or a fluororesin. As a material blended with a fluororesin, a low transmission loss material having a dielectric loss tangent smaller than about 0.001 is preferably used, and for example, a liquid crystal polymer or the like may be used. In the present preferred embodiment, as a material of the first core material 110 and the second core material 120, a glass epoxy resin is used.

Next, a non-limiting example of a manufacturing process of the component built-in substrate 300 of the present preferred embodiment will be described. First, a manufacturing process of the multilayer ceramic capacitor 1 embedded in the substrate 100 will be described.

A dielectric sheet for the dielectric layer 20 and a conductive paste for the internal electrode layer 30 are provided. The dielectric sheet and the conductive paste for the internal electrode include a binder and a solvent. A known binder and solvent may be used.

A conductive paste for the internal electrode layer 30 is printed on the dielectric sheet in a predetermined pattern by, for example, screen printing or gravure printing. Thus, the dielectric sheet in which the pattern of the first internal electrode layer 31 is formed, and the dielectric sheet in which the pattern of the second internal electrode layer 32 is formed are prepared.

By a predetermined number of the dielectric sheets on which the pattern of the internal electrode layer is not printed being laminated, a portion defining and functioning as the first main surface side outer layer portion 12 adjacent to or in a vicinity of the first main surface TS1 is formed. Thereafter, the dielectric sheet on which the pattern of the first internal electrode layer 31 is printed, and the dielectric sheet on which the pattern of the second internal electrode layer 32 is printed are sequentially laminated on top thereof, a result of which a portion defining and functioning as the inner layer portion 11 is formed. Thereafter, a predetermined number of the dielectric sheet on which the pattern of the internal electrode layer is not printed are laminated on the portion defining and functioning as the inner layer portion 11, a result of which a portion defining and functioning as the second main surface side outer layer portion 13 adjacent to or in a vicinity of the second main surface TS2 is formed. Thus, a laminated sheet is manufactured.

By the laminated sheet being pressed in the laminating direction, for example, by hydrostatic pressing, the laminated block is manufactured.

By the laminated block being cut to a predetermined size, the laminated chip is cut out. At this time, corners and ridges of the laminated chip may be rounded by barrel polishing or the like.

The laminated chip is fired to manufacture the multilayer body 10. The firing temperature depends on the materials of the dielectric layer 20 and the internal electrode layer 30. However, the firing temperature is preferably about 900° C. or more and about 1400° C. or less, for example.

Conductive pastes defining and functioning as the first foundation electrode layer 50A and the second foundation electrode layer 50B are applied to both end surfaces of the multilayer body 10. In the present preferred embodiment, the first foundation electrode layer 50A and the second foundation electrode layer 50B are fired layers. A conductive paste including a glass component and metal is applied to the multilayer body 10 by, for example, a method such as dipping. Thereafter, a firing process is performed to form the first foundation electrode layer 50A and the second foundation electrode layer 50B. The temperature of the firing treatment at this time is preferably about 700° C. or higher and about 900° C. or less, for example.

In a case in which the multilayer chip before firing and the conductive paste applied to the laminated chip are fired simultaneously, it is preferable, for example, that the fired layer is formed by firing a material to which a ceramic material instead of a glass component is added. At this time, it is particularly preferable to use the same type of ceramic material as the dielectric layer 20 as the ceramic material to be added, for example. In this case, a conductive paste is applied to the laminated chip before firing, and the laminated chip and the conductive paste applied to the laminated chip are fired simultaneously, thereby forming the multilayer body 10 having a fired layer formed therein.

In a case of providing a thin film layer as the first foundation electrode layer 50A and the second foundation electrode layer 50B, a thin film layer may be provided on a portion of the first main surface TS1 and a portion of the second main surface TS2 of the multilayer body 10. The thin film layer may be, for example, a sputtering electrode by a sputtering method. In a case of providing the sputtering electrode on a portion of the first main surface TS1 and a portion of the second main surface TS2 of the multilayer body 10 as the first foundation electrode layer 50A and the second foundation electrode layer 50B, the fired layer may be provided on the first end surface LS1 and the second end surface LS2. Alternatively, a plated layer (described below) may be directly provided on the multilayer body 10 without providing any foundation electrode layer on the first end surface LS1 and the second end surface LS2.

Next, the first plated layer 70A and the second plated layer 70B are provided. The first plated layer 70A and the second plated layer 70B may be provided on the surfaces of the first foundation electrode layer 50A and the second foundation electrode layer 50B, or may be formed directly on the multilayer body 10. In the present preferred embodiment, as the first plated layer 70A and the second plated layer 70B, the Cu-plated layers are provided on the surfaces of the first foundation electrode layer 50A and the second foundation electrode layer 50B. The Cu-plated layer may be a single layer or a plurality of layers.

Next, the first connection portion 80A and the second connection portion 80B are provided on the Cu-plated layer. For example, masking of any shape is performed on the Cu-plated layer, and Cu is deposited by a plating method. Thus, the first connection portion 80A and the second connection portion 80B each in a columnar shape are provided on the Cu-plated layer. The lengths T3 of the first connection portion 80A and the second connection portion 80B are each adjusted by controlling the time of plating, current density, etc. The method of forming the first connection portion 80A and the second connection portion 80B is not limited to the plating process. For example, a sputtering method or minute terminal pins may be used for the formation.

By a manufacturing process as described above, the multilayer ceramic capacitor 1 including the first connection portion 80A and the second connection portion 80B is manufactured.

Next, a manufacturing process of manufacturing the component built-in substrate 300 by embedding the multilayer ceramic capacitor 1 in the substrate 100 will be described with reference to FIGS. 6A to 6G.

As shown in FIG. 6A, the first core material 110 is prepared, and the cavity 111 is formed in the first core material 110. The first core material 110 may be cured after forming the cavity 111, or may be cured at this point in a semi-cured state and may be cured together with the second core material 120 (described below).

Figure 6B:
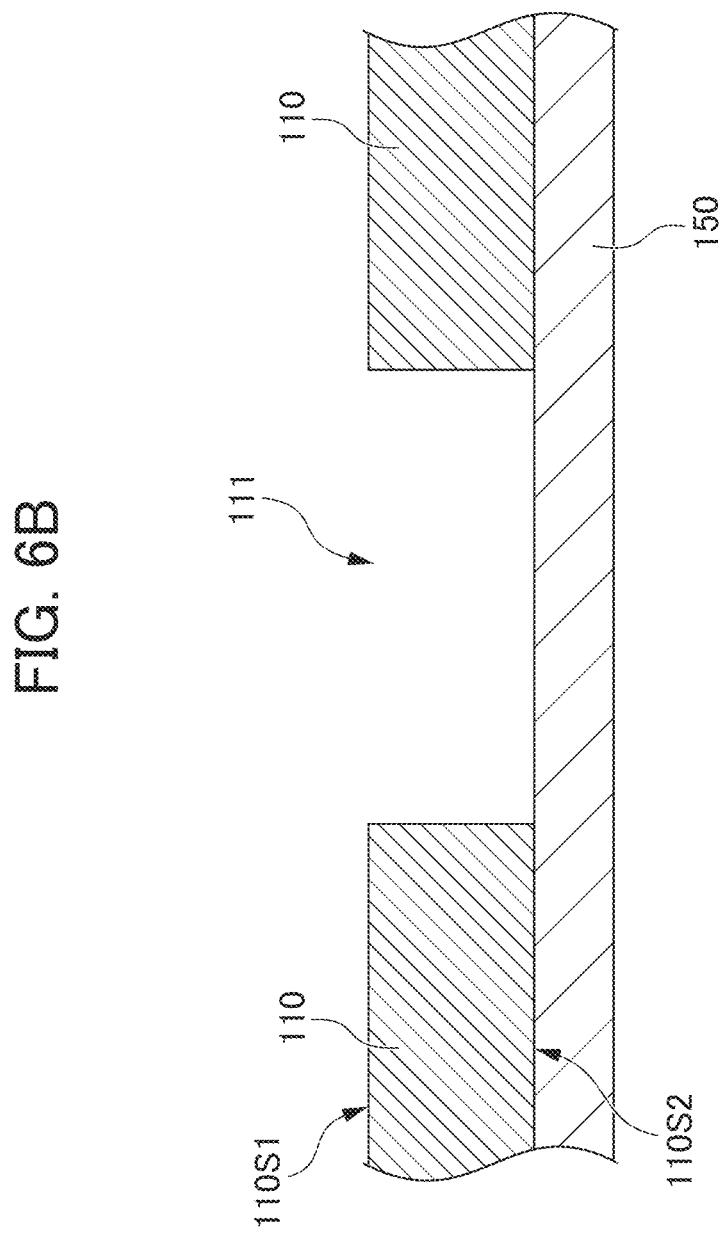
FIG. 6B shows the manufacturing process of the component built-in substrate of the first preferred embodiment of the present invention.

Next, as shown in FIG. 6B, a retaining tape 150 is attached to the second front surface 110S2 which is the back surface side of the first core material 110.

Next, as shown in FIG. 6C, the multilayer ceramic capacitor 1 including the first connection portion 80A and the second connection portion 80B is provided in the cavity 111 of the first core material 110. At this time, the multilayer ceramic capacitor 1 is provided on the tape 150. As shown in FIG. 6C, the first main surface TS1 of the multilayer ceramic capacitor 1 (i.e., the side on which the first connection portion 80A and the second connection portion 80B are provided) is opposed to the tape 150.

Figure 6D:
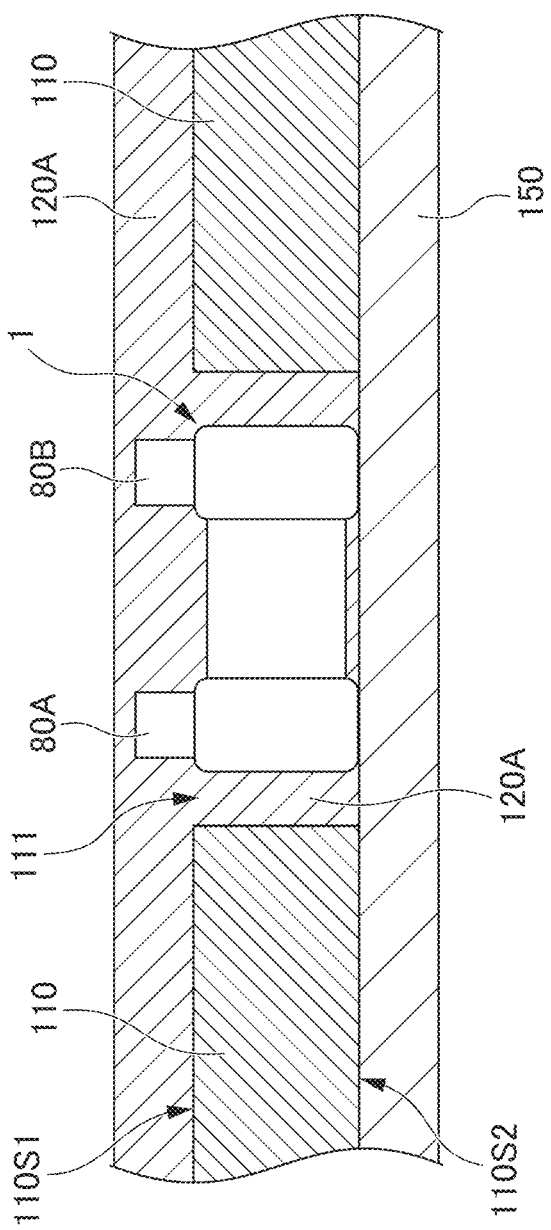
FIG. 6D shows the manufacturing process of the component built-in substrate of the first preferred embodiment of the present invention.

Next, as shown in FIG. 6D, a resin 120A defining and functioning as the second core material 120 is provided to cover the surface of the multilayer ceramic capacitor 1 including the first connection portion 80A and the second connection portion 80B. More specifically, a resin sheet is bonded to the first front surface 110S1 of the first core material 110, and subjected to hot-pressing. Accordingly, as shown in FIG. 6D, the resin 120A enters the cavity 111 of the first core material 110, and the layer of the resin 120A is provided on the first main surface TS1 of the multilayer ceramic capacitor 1 and on the first front surface 110S1 of the first core material 110. Then, the resin 120A is combined with a resin 120B (described below) to form the second core material 120. Upon performing hot pressing, a top tape (not shown) may be attached beforehand to the surface of the resin sheet opposite to the attachment surface of the resin sheet, and after hot pressing, the top tape may be peeled off from the surface of the resin 120A.

Next, a semi-curing treatment of the resin 120A forming the second core material 120 is performed. For example, the semi-curing treatment of the resin 120A is performed by placing a substrate in the state of FIG. 6D in an atmosphere of about 80° C. or higher and about 120° C. or less for 10 minutes or more and 30 minutes or less. The semi-cured resin 120A has adequate mechanical strength and easy processability.

Next, as shown in FIG. 6E, the tape 150 is peeled from the second front surface 110S2 of the first core material 110.

Figure 6F:
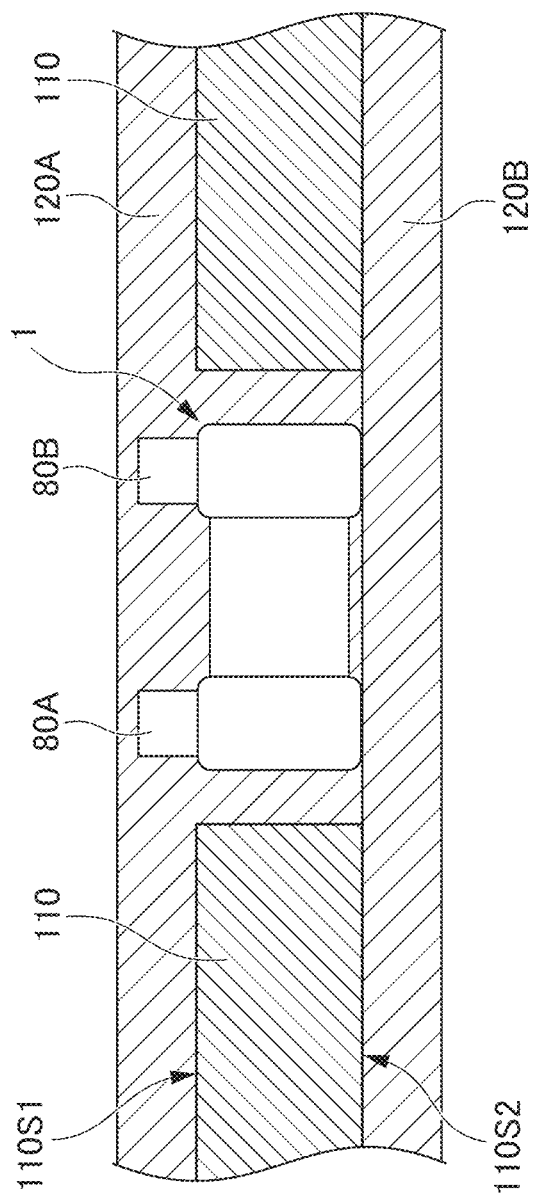
FIG. 6F shows the manufacturing process of the component built-in substrate of the first preferred embodiment of the present invention.

Next, as shown in FIG. 6F, the resin sheet is attached to the second front surface 110S2 of the first core material 110, and is subjected to hot-pressing. Thus, the layer of the resin 120B is provided on the second main surface TS2 of the multilayer ceramic capacitor 1 and the second front surface 110S2 of the first core material 110. Upon performing hot pressing, a top tape (not shown) may be attached beforehand to the surface of the resin sheet opposite to the attachment surface of the resin sheet, and after hot pressing, the top tape may be peeled off from the surface of the resin 120B.

Next, a semi-curing treatment of the resin 120B forming the second core material 120 is performed. For example, the semi-curing treatment of the resin 120B is performed by placing a substrate in the state of FIG. 6F in an atmosphere of about 80° C. or higher and about 120° C. or less for about 10 minutes or more and about 5 30 minutes or less. The semi-cured resin 120B has adequate mechanical strength and easy processability. Then, as shown in FIG. 6G, the resin 120A in the semi-cured state and the resin 120B in the semi-cured state are combined to form the second core material 120 in the semi-cured state.

The component built-in substrate 300 of the present preferred embodiment is manufactured by the above-described manufacturing process. The first connection portion 80A and the second connection portion 80B of the multilayer ceramic capacitor 1 in the component built-in substrate 300 of the present preferred embodiment manufactured by the above-described manufacturing process are completely covered with the second core material 120. That is, the first connection portion 80A and the second connection portion 80B of the multilayer ceramic capacitor 1 are not exposed at the surface of the substrate 100.

Figure 6G:
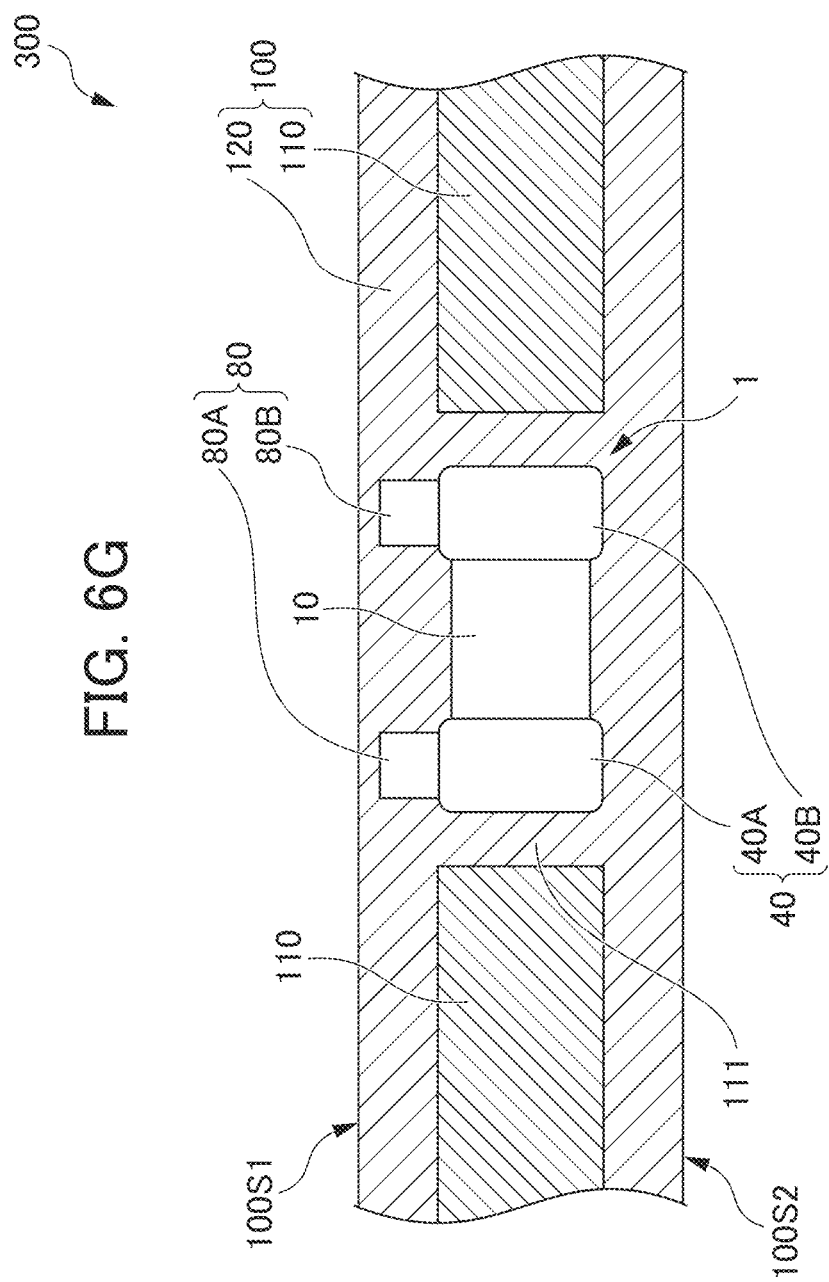
FIG. 6G shows the manufacturing process of the component built-in substrate of the first preferred embodiment of the present invention.

The component built-in substrate 300 of the present preferred embodiment may be subjected to curing treatment of the core material in the state of FIG. 6G, and a portion covering the surface of at least the multilayer ceramic electronic component of the core material may be cured. More specifically, for example, the entire core material including the second core material 120 may be cured by placing the substrate in the state of FIG. 6G in an atmosphere of about 170° C. or higher and about 190° C. or less for about 30 minutes or more and about 50 minutes or less. In this case, the core material has high mechanical strength. Therefore, at the time of handling of the component built-in substrate 300, for example, subsequent shipment and transportation, the possibility that the component built-in substrate 300 is damaged is able to be reduced or prevented.

All or at least a portion of the core material of the component built-in substrate 300 of the present preferred embodiment may remain in the semi-cured state. For example, at least a portion of the core material covering the surface of the multilayer ceramic electronic component may remain in a semi-cured state. More specifically, at least the second core material 120 may remain in a semi-cured state. In this case, handling of the component built-in substrate 300, for example, shipment and transportation, is able to be performed in a state having adequate mechanical strength and easy processability.

In general, a cured state of a thermoplastic resin, for example, an epoxy resin is divided into 3 stages of an A stage, a B stage, and a C stage. The A stage is in an uncured state, the B stage is in a semi-cured state, and the C stage is in a cured state. After the C stage, the resin is no longer softened by heating. As described above, the core material included in the component built-in substrate 300 of the present preferred embodiment is in the state of the B stage or the C stage.

As described above, the manufacturing process of the component built-in substrate 300 of the present preferred embodiment includes providing the multilayer ceramic capacitor 1 including the first connection portion 80A provided to protrude from the first external electrode 40A and the second connection portion 80B provided to protrude from the second external electrode 40B providing the core material included in the substrate 100; covering entirely the surface of the multilayer ceramic capacitor 1 including the first connection portion 80A and the second connection portion 80B with the core material, and embedding the multilayer ceramic capacitor 1 in the core material and semi-curing or curing the core material. Furthermore, the process may further include shipping the component built-in substrate 300 in a state in which the first connection portion 80A and the second connection portion 80B protrude toward the surface of the substrate 100, but are not exposed at the surface of the substrate 100.

Thereafter, in the component built-in substrate 300 of the present preferred embodiment manufactured by the above manufacturing process, the surface the component built-in substrate 300 toward which the first connection portion 80A and the second connection portion 80B protrude (i.e., the first front surface 100S1 in the present preferred embodiment) is scraped off, and thus the surfaces of the first connection portion 80A and the second connection portion 80B covered with the core material are exposed. Thereafter, the wiring patterns (refer to FIGS. 9 and 10) are formed on the exposed surfaces of the first connection portions 80A and the second connection portions 80B. Thus, the formation of metal oxide on the surfaces of the external electrode 40 and the connection portion 80 is significantly reduced or prevented, and the deterioration of the electrical connection state between the external electrode 40 and the wiring patterns of the substrate 100 to be connected later is significantly reduced or prevented.

As described above, when the component built-in substrate 300 of the present preferred embodiment is mounted on an electronic device, for example, the surface of the component built-in substrate 300 is scraped off to expose the connection portion 80 connected to the external electrode 40, and thus the wiring pattern is able to be provided on the exposed connection portion 80. In other words, the connection portion 80 connected to the external electrode 40 is not exposed at the surface of the component built-in substrate 300 until just before mounting on the electronic device. Therefore, the external electrode 40 of the multilayer ceramic capacitor 1 and the connection portion 80 connected to the external electrode 40 are able to be prevented from coming into contact with oxygen in the air or moisture including dissolved oxygen. Therefore, the oxidation of the external electrode 40 of the multilayer ceramic capacitor 1 and the connection portion 80 connected to the external electrode 40 is able to be reduced or prevented. Therefore, deterioration of the connection resistance caused by metal oxide being produced in the external electrode 40 of the multilayer ceramic capacitor 1 and the connection portion 80 connected to the external electrode 40 is able to be reduced or prevented, and thus, the electrical characteristics of the substrate are able to be stabilized.

The first connection portion 80A and the second connection portion 80B of the present preferred embodiment are provided on the same surface of the multilayer body 10, and each protrude toward one surface of the substrate 100. More specifically, the first connection portion 80A and the second connection portion 80B are both provided on the first main surface TS1, and each protrude toward the first front surface 100S1 of the substrate 100. Therefore, in the component built-in substrate 300 of the present preferred embodiment, only the first front surface 100S1 of the substrate 100 is scraped off, and thus the surface of the first connection portion 80A connected to the first external electrode 40A and the surface of the second connection portion 80B connected to the second external electrode 40B are able to be exposed.

Figure 7:
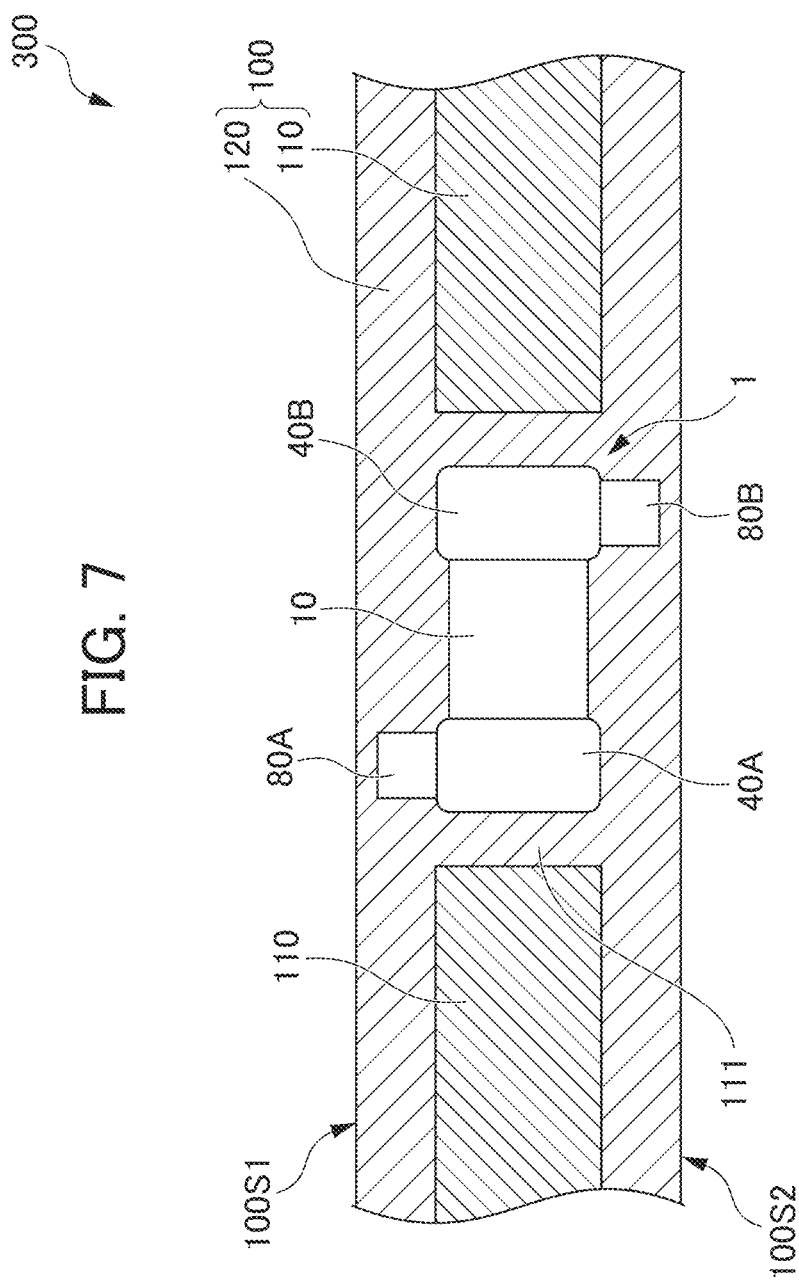
FIG. 7 is a cross-sectional view showing a first modified example of the component built-in substrate of the first preferred embodiment of the present invention.

FIG. 7 is a cross-sectional view showing a first modified example of the component built-in substrate 300 of the present preferred embodiment. However, similar to FIG. 1, the multilayer ceramic capacitor 1 embedded in the substrate 100 is not shown by a cross-sectional view, but by an external view.

In the first preferred embodiment, the second connection portion 80B is provided on the first main surface TS1 via the second external electrodes 40B. However, in the present modified example, the second connection portion 80B is provided on the second main surface TS2 via the second external electrodes 40B.

As shown in FIG. 7, in the present modified example, the second connection portion 80B of the multilayer ceramic capacitor 1 protrudes toward the second front surface 100S2 of the substrate 100 (i.e., the opposite side to the first connection portion 80A).

Here, the external electrode 40 of the multilayer ceramic capacitor 1 and the connection portion 80 are completely covered with the second core material 120, as in the above preferred embodiment. Therefore, similar to the above preferred embodiment, the features of the component built-in substrate 300 of this modified example also reduce or prevent the generation of metal oxide on the surface of the external electrode 40 and the connection portion 80, and deterioration of the electrical connection state between the external electrode 40 and the wiring pattern of the substrate 100 to be connected later.

Furthermore, by providing the first connection portion 80A and the second connection portion 80B on different surfaces of the multilayer body 10 as in the present modified example, wiring using the upper and lower surfaces of the substrate 100, for example, is facilitated. Therefore, the degrees of freedom in the structure of the wiring pattern with respect to the substrate 100 are able to be increased. In the present modified example, when the wiring pattern is provided, the second front surface 100S2 is also scraped off, thereby exposing the surface of the second connection portion 80B.

At least one of the first connection portion 80A and the second connection portion 80B may be provided on the first end surface LS1, the first side surface WS1, or the second side surface WS2. In this case, the intermediate portion of the columnar portion may be bent so that the tip of the columnar portion included in the connection portion 80 protrudes toward the first front surface 100S1 or the second front surface 100S2 of the substrate 100.

Figure 8:
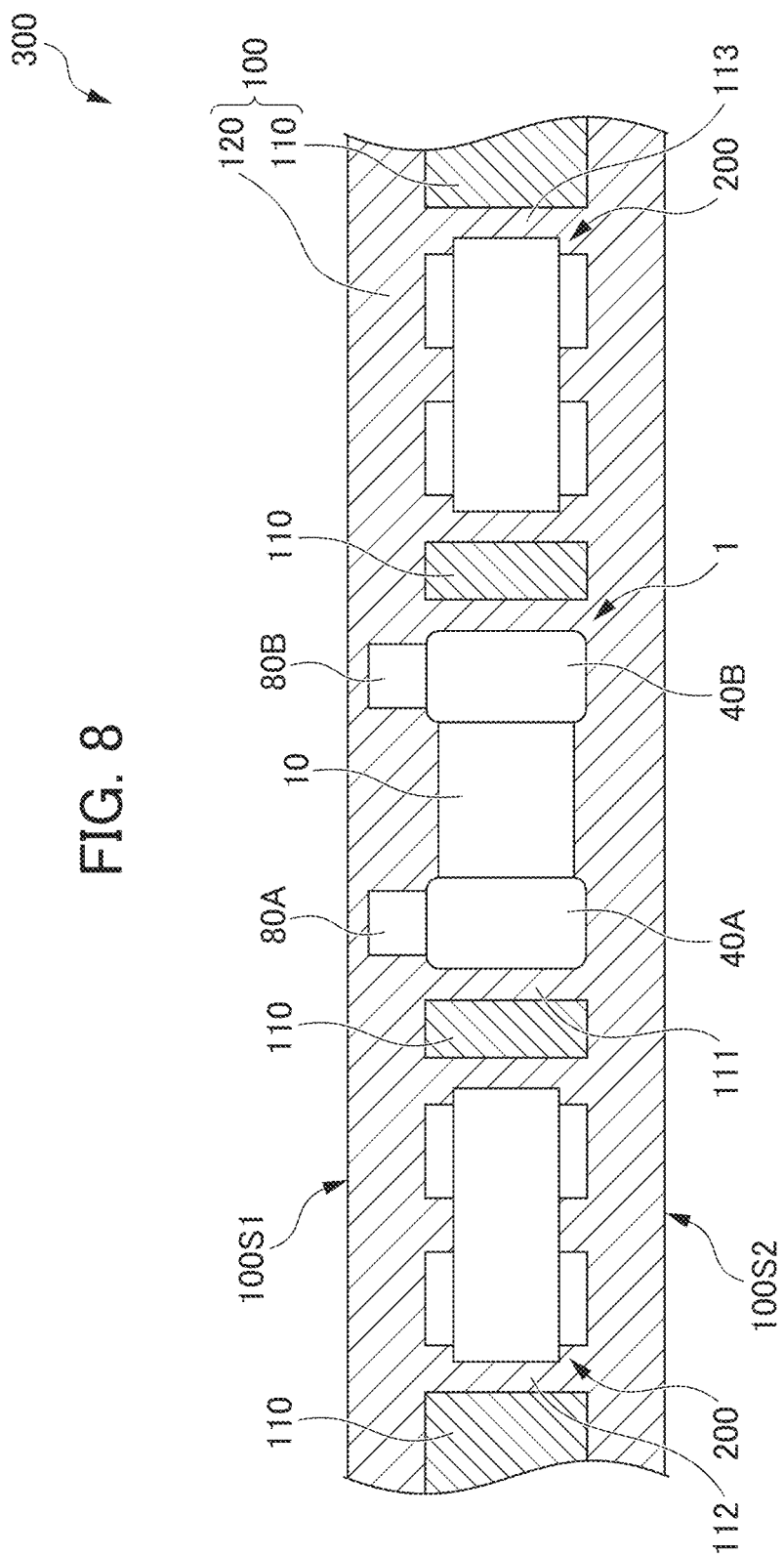
FIG. 8 is a cross-sectional view showing a second modified example of the component built-in substrate of the first preferred embodiment of the present invention.

FIG. 8 is a cross-sectional view showing a second modified example of the component built-in substrate 300 of the present preferred embodiment. However, the multilayer ceramic capacitor 1 and other electronic components 200 which are embedded in the substrate 100 are not shown by a cross-sectional view but by an external view.

In the above preferred embodiment, only the multilayer ceramic capacitor 1 is embedded in the substrate 100. However, in this modified example, other electronic components 200 in addition to the multilayer ceramic capacitor 1 are also embedded in the substrate 100.

As shown in FIG. 8, in this modified example, the first core material 110 includes a second cavity 112 and a third cavity 113 in addition to the cavity 111. Furthermore, the electronic components 200 are provided in the second cavity 112 and the third cavity 113. The second core material 120 covers the surfaces of the electronic components 200 in addition to the multilayer ceramic capacitor 1.

Thereafter, the electronic components 200 are connected to the wiring pattern (not shown) of the substrate 100 by the formation of a via hole conductor (not shown).

Thus, the component built-in substrate 300 may include the other electronic components 200 in addition to the multilayer ceramic capacitor 1 therein. There is no particular limitation on the number of multilayer ceramic capacitor 1 to be embedded in the substrate 100, and one or a plurality of multilayer ceramic capacitor 1 may be embedded in the substrate 100.

According to the component built-in substrate 300 of the present preferred embodiment, the following features are provided.

A component built-in substrate 300 according to the present preferred embodiment includes a multilayer body 10 including a plurality of stacked ceramic layers 20 and a plurality of stacked inner conductive layers 30, the multilayer body further including a first main surface TS1 and a second main surface TS2 on opposite sides in a height direction, a first side surface WS1 and a second side surface WS2 on opposite sides in a width direction orthogonal or substantially orthogonal to the height direction, and a first end surface LS1 and a second end surface LS2 on opposite sides in a length direction orthogonal or substantially orthogonal to the height direction and the width direction; a multilayer ceramic electronic component 1 including a first external electrode 40A provided adjacent to or in a vicinity of the first end surface LS1 of the multilayer body 10 and connected to the inner conductive layer 30, and a second external electrode 40B provided adjacent to or in a vicinity of the second end surface LS2 of the multilayer body 10 and connected to the inner conductive layer 30; and a substrate 100 including the multilayer ceramic electronic component 1 embedded therein, wherein the multilayer ceramic electronic component 1 includes a first connection portion 80A that protrudes from the first external electrode 40A, and a second connection portion 80B that protrudes from the second external electrode 40B; the substrate 100 includes a core material 110, 120; the multilayer ceramic electronic component 1 including the first connection portion 80A and the second connection portion 80B includes a surface covered by the core material 110, 120, and embedded in the substrate 100; the first connection portion 80A protrudes toward a surface of the substrate 100, and is not exposed at the surface of the substrate 100; and the second connection portion 80B protrudes toward the surface of the substrate 100, and is not exposed at the surface of the substrate 100.

Accordingly, the component built-in substrate 300 is able to be provided that reduces or prevents deterioration of the electrical connection state between the external electrode 40 and the wiring pattern of the substrate 100.

According to the present preferred embodiment, the first external electrode 40A includes an outermost surface provided by Cu-plating, and the second external electrode 40B includes an outermost surface provided by Cu-plating. Accordingly, the resistance component is able to be reduced.

According to the present preferred embodiment, the first external electrode 40A is provided on at least one of the first main surface TS1, the second main surface TS2, the first side surface WS1, and the second side surface WS2, in addition to the first end surface LS1, and the second external electrode 40B is provided on at least one of the first main surface TS1, the second main surface TS1, the first side surface WS1, and the second side surface WS2, in addition to the second end surface LS2. Accordingly, for example, the first connection portion 80A and the second connection portion 80B are able to protrude respectively from the surface on which the first external electrode 40A is provided and the surface on which the second external electrode 40B is provided.

According to the present preferred embodiment, the first external electrode 40A is provided on a portion of the first main surface TS1, a portion of the second main surface TS2, a portion of the first side surface WS1, and a portion of the second side surface WS2, in addition to the first end surface LS1, and the second external electrode 40B is provided on a portion of the first main surface TS1, a portion of the second main surface TS2, a portion of the first side surface WS1, and a portion of the second side surface WS2, in addition to the second end surface LS2. Accordingly, for example, the first connection portion 80A and the second connection portion 80B are able to protrude respectively from the surface on which the first external electrode 40A is provided and the surface on which the second external electrode 40B is provided.

According to the present preferred embodiment, the first connection portion 80A is provided on at least one of the first end surface LS1, the first main surface TS1, the second main surface TS2, the first side surface WS1, and the second side surface WS2 on which the first external electrode exists, and the second connection portion 80B is provided on at least one of the second end surface LS2, the first main surface TS1, the second main surface TS2, the first side surface WS1, and the second side surface WS2 on which the second external electrode exists. Accordingly, the first connection portion 80A and the second connection portion 80B are able to protrude respectively from the surface on which the first external electrode 40A is provided and the surface on which the second external electrode 40B is provided, and thus the first connection portion 80A and the second connection portion 80B with the wiring pattern of the substrate 100 are then able to be joined.

According to the present preferred embodiment, the first connection portion 80A includes a single connection portion or a plurality of connection portions, and the second connection portion 80B includes a single connection portion or a plurality of connection portions. By setting the number of the first connection portion 80A and the second connection portion 80B to be singular, the multilayer ceramic capacitor 1 is able to be provided with a simple structure. Furthermore, by providing the plurality of first connection portion 80A and the second connection portion 80B, for example, the number of electrically connecting points between the first connection portion 80A and the second connection portion 80B, and the wiring pattern of the substrate 100, is able to be increased.

According to the present preferred embodiment, a metal included in the first connection portion 80A and the second connection portion 80B includes a metal having a lower resistivity than a metal included at least in the inner conductive layer 30. Accordingly, the resistance components are able to be reduced.

According to the present preferred embodiment, the first connection portion 80A and the second connection portion 80B each include a shorter length T3 in the protruding direction than a length in a height direction connecting the first main surface TS1 and the second main surface TS2 of the multilayer body 10. Accordingly, the first connection portion 80A and the second connection portion 80B are able to be reduced or prevented from being damaged by the effect of an external force.

According to the present preferred embodiment, the first connection portion 80A includes a longer length T3 in the protruding direction than a thickness of the first external electrode 40A on which the first connection portion 80A is provided, and the second connection portion 80B includes a longer length T3 in the protruding direction than a thickness of the second external electrode 40B on which the second connection portion 80B is provided. Accordingly, the operation of connecting the wiring pattern 130 of the substrate 100 to the first connection portion 80A and the second connection portion 80B is facilitated.

According to the present preferred embodiment, the first connection portion 80A is provided on at least one of the first main surface TS1 or the second main surface TS2; the second connection portion 80B is provided on at least one of the first main surface TS1 or the second main surface TS2; when defining a length in the length direction of the first external electrode 40A having a surface on which the first connection portion 80A is provided as L1, a length in the width direction of the first external electrode 40A having the surface on which the first connection portion 80A is provided as W1, a length in the length direction of the second external electrode 40B having a surface on which the second connection portion 80B is provided as L2, and a length in the width direction of the second external electrode 40B having the surface on which the second connection portion 80B is provided as W2, a cross-sectional area A1 of the first connection portion 80A when cut in a direction orthogonal or substantially orthogonal to the protruding direction of the first connection portion 80A satisfies expression (1) below, and a cross-sectional area B1 of the second connection portion 80B when cut in a direction orthogonal or substantially orthogonal to the protruding direction of the second connection portion 80B satisfies expression (2) below. Accordingly, the contact area between the first connection portion 80A and the second connection portion 80B, and the wiring pattern of the substrate 100 to be connected later are able to be provided, are able to be provided, and the adhesion force and the connection stability are able to be significantly improved.

$$(L1 \times 0.03) \times (W1 \times 0.03) \leq A1 \leq L1 \times W1 \quad (1)$$

$$(L2 \times 0.03) \times (W2 \times 0.03) \leq B1 \leq L2 \times W2 \quad (2)$$

According to the present preferred embodiment, the first connection portion 80A is provided on at least one of the first side surface WS1 or the second side surface WS2; the second connection portion 80B is provided on at least one of the first side surface WS1 or the second side surface WS2; when defining a length in the length direction of the first external electrode 40A having a surface on which the first connection portion 80A is provided as L1, a length in the height direction of the first external electrode 40A having the surface on which the first connection portion 80A is provided as T1, a length in the length direction of the second external electrode 40B having a surface on which the second connection portion 80B is provided as L2, and a length in the height direction of the second external electrode 40B having the surface on which the second connection portion 80B is provided as T2, a cross-sectional area A1 of the first connection portion 80A when cut in a direction orthogonal or substantially orthogonal to the protruding direction of the first connection portion 80A satisfies expression (3) below, and a cross-sectional area B1 of the second connection portion 80B when cut in a direction orthogonal or substantially orthogonal to the protruding direction of the second connection portion 80B satisfies expression (4) below. Accordingly, the contact area between the first connection portion 80A and the second connection portion 80B, and the wiring pattern of the substrate 100 to be connected later, are able to be provided, and the adhesion force and the connection stability are able to be improved.

$$(L1 \times 0.03) \times (T1 \times 0.03) \leq A1 \leq L1 \times T1 \quad (3)$$

$$(L2 \times 0.03) \times (T2 \times 0.03) \leq B1 \leq L2 \times T2 \quad (4)$$

According to the present preferred embodiment, the core material is a material provided by blending a glass epoxy resin, a polyimide resin, or a fluororesin. By using these materials as the core material, the multilayer ceramic electronic component is able to provide predetermined electrical characteristics.

According to the present preferred embodiment, a surface of the component built-in substrate 300 in the direction of the first connection portion 80A protruding and the direction of the second connection portion 80B protruding is scraped off to expose a surface of the first connection portion 80A and a surface of the second connection portion 80B covered by the core material, and thus a wiring pattern on an exposed surface of the first connection portion 80A and an exposed surface of the second connection portion 80B is able to be provided. Therefore, the component built-in substrate 300 of the present preferred embodiment reduces or prevents the generation of metal oxide on the surface of the external electrode 40 and the connection portion 80, and reducing or preventing deterioration of the electrical connection state between the external electrode 40 and the wiring pattern of the substrate 100 to be connected later.

Second Preferred Embodiment

Figure 9:
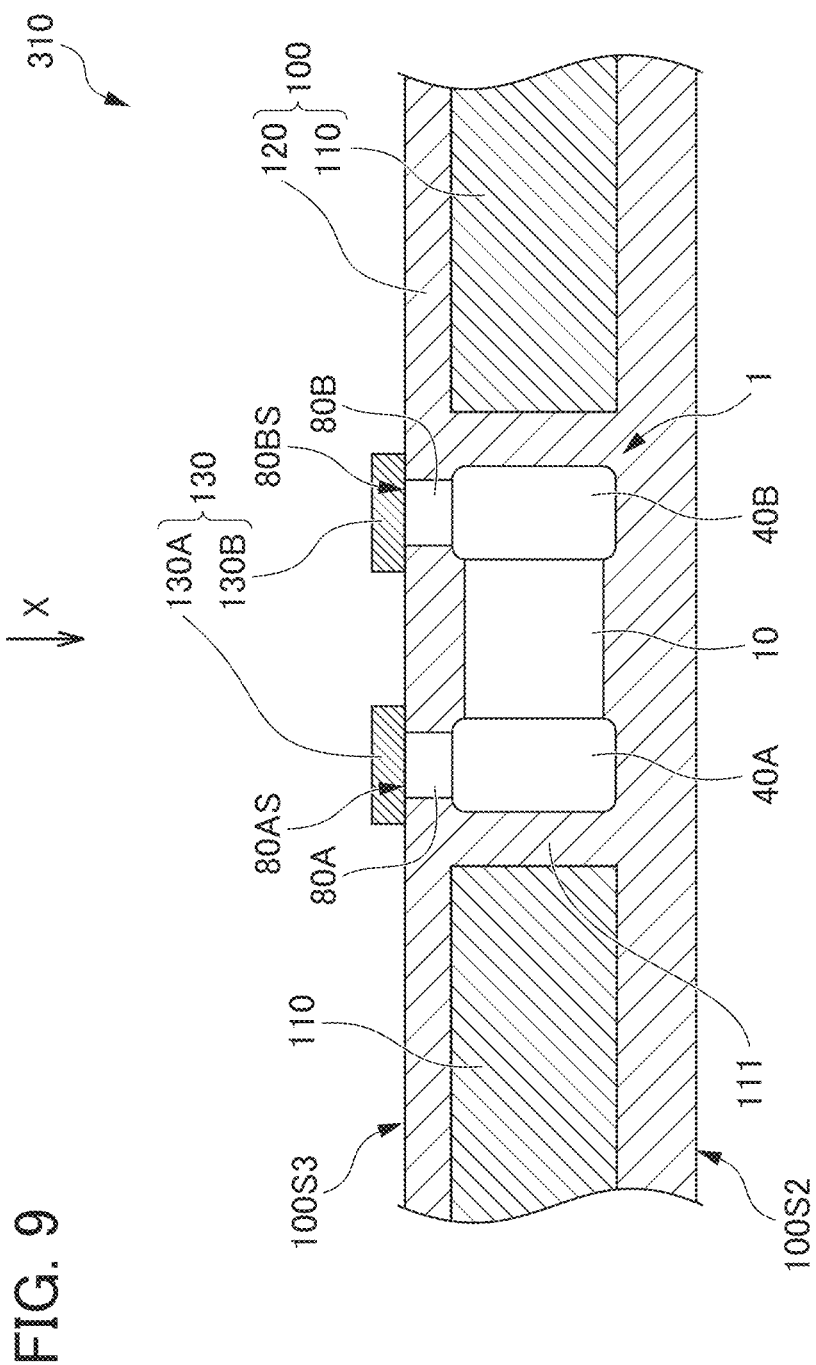
FIG. 9 is a cross-sectional view of the component built-in substrate of a second preferred embodiment of the present invention.
Figure 10:
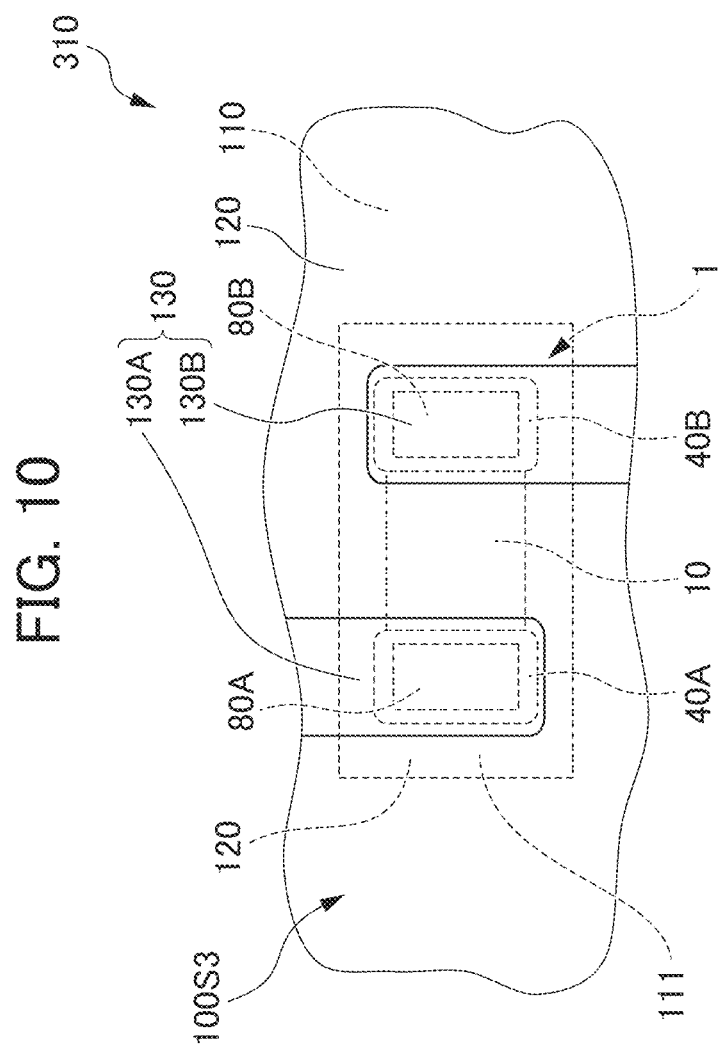
FIG. 10 is an arrow view when the component built-in substrate of FIG. 9 is viewed in the direction of the arrow X.

Hereinafter, a component built-in substrate 310 according to a second preferred embodiment of the present invention will be described. In the following description, the same or corresponding components as those of the first preferred embodiment are denoted by the same reference numerals, and detailed description thereof is omitted. FIGS. 9 and 10 are diagrams showing the component built-in substrate 310 of the present preferred embodiment.

In the first preferred embodiment, the multilayer ceramic capacitor 1 including the first connection portion 80A and the second connection portion 80B is completely covered with the second core material 120. Also in the present preferred embodiment, the multilayer ceramic capacitor 1 is basically covered by the second core material 120, and is embedded in the substrate 100. However, in the present preferred embodiment, the ends of the first connection portion 80A and the second connection portion 80B are exposed from the surface of the second core material 120. Furthermore, a wiring pattern 130 is provided on the exposed surfaces of the ends.

FIG. 9 is a cross-sectional view of the component built-in substrate 310. However, the multilayer ceramic capacitor 1 embedded in the substrate 100 is not shown by a cross-sectional view but by an external view. FIG. 10 is an arrow view when the component built-in substrate 310 of FIG. 9 is viewed in the direction of the arrow X. As shown in FIGS. 9 and 10, the multilayer ceramic capacitor 1 is embedded in the substrate 100.

The component built-in substrate 310 includes the multilayer ceramic capacitor 1 as a multilayer ceramic electronic component, and the substrate 100 including the multilayer ceramic capacitor 1 therein.

Similar to the first preferred embodiment, the first connection portion 80A of the multilayer ceramic capacitor 1 of the present preferred embodiment protrudes toward the first front surface 100S1 of the substrate 100. However, the first connection portion 80A of the present preferred embodiment includes a first exposed surface 80AS which is exposed from the surface of the substrate 100.

Similar to the first preferred embodiment, the second connection portion 80B of the multilayer ceramic capacitor 1 of the present preferred embodiment protrudes toward the first front surface 100S1 of the substrate 100. However, the second connection portion 80B of the present preferred embodiment includes a second exposed surface 80BS which is exposed from the surface of the substrate 100.

The substrate 100 of the present preferred embodiment includes a third front surface 100S3 and a wiring pattern 130 provided on the third front surface 100S3.

The third front surface 100S3 of the substrate 100, and the first exposed surface 80AS of the first connection portion 80A and the second exposed surface 80BS of the second connection portion 80B are formed, for example, by scraping off the vicinity of the surface layer of the first front surface 100S1 of the component built-in substrate 300 with which the manufacturing process is described in the first preferred embodiment as shown in FIG. 6G, and further optionally performing surface treatment. In the present preferred embodiment, the third front surface 100S3 of the substrate 100 is a surface of the core material continuous with the first exposed surface 80AS as well as the second exposed surface 80BS.

The wiring pattern 130 includes a first wiring pattern 130A and a second wiring pattern 130B.

The first wiring pattern 130A is provided on the first exposed surface 80AS of the first connection portion 80A and on the third front surface 100S3 of the substrate 100. The first wiring pattern 130A covers the first exposed surface 80AS. The first wiring pattern 130A is electrically connected to the first external electrode 40A via the first connection portion 80A. The thickness of the first wiring pattern 130A is not particularly limited; however, it may be, for example, about 20 μm or more and about 200 μm or less.

The second wiring pattern 130B is provided on the second exposed surface 80BS of the second connection portion 80B and the third front surface 100S3 of the substrate 100. The second wiring pattern 130B covers the second exposed surface 80BS. The second wiring pattern 130B is electrically connected to the second external electrode 40B via the second connection portion 80B. The thickness of the second wiring pattern 130B is not particularly limited, but may be, for example, about 20 μm or more and about 200 μm or less.

The materials of the first wiring pattern 130A and the second wiring pattern 130B are not particularly limited, and for example, metals such as Cu, Au, Pd, and Pt may be used.

The metal included in the first connection portion 80A and the second connection portion 80B, and the metal included in the first wiring pattern 130A and the second wiring pattern 130B may both be Cu. Accordingly, the connection resistance of both of the connection portions is able to be reduced, and thus, deterioration of the substrate characteristics is able to be reduced or prevented.

In the present preferred embodiment, the multilayer ceramic capacitor 1 is basically covered by the second core material 120 and embedded in the substrate 100. Furthermore, the wiring pattern 130 is in a state of being provided on the first exposed surface 80AS and the second exposed surface 80BS which are exposed from the surface of the second core material 120. Therefore, the features of the component built-in substrate 310 of the present preferred embodiment also reduce or prevent the generation of metal oxide on the surface of the external electrode 40 and the connection portion 80, and reduces or prevents deterioration of the electrical connection state between the wiring pattern 130 of the external electrode 40 and the substrate 100.

Here, the skewness Rsk of the roughness curves of the first exposed surface 80AS of the first connection portion 80A and the second exposed surface 80BS of the second connection portion 80 of the multilayer ceramic capacitor 1 is larger than the skewness Rsk of the roughness curves of the surface of the core material continuous with the first exposed surface 80AS and the third front surface 100S3 which is the surface of the core material continuous with the second exposed surface 80BS.

Furthermore, it is preferable, for example, that the first skewness Rsk1 which is a value of the skewness Rsk of the roughness curves of the first exposed surface 80AS and the second exposed surface 80BS, and the second skewness Rsk2 which is a value of the skewness Rsk of the roughness curves of the surface of the core material continuous with the first exposed surface 80AS and the third front surface 100S3 which is a surface of the core material continuous with the exposed surface 80BS satisfy the following expression (5).

$$-3 < Rsk2 < Rsk1 < 1.5 \tag{5}$$

Here, the skewness Rsk is a parameter defined in JIS B 0601:2013, indicating the degree of asymmetry of the probability density function of the roughness curve. That is, the skewness Rsk is an indicator showing the degree of asymmetry between the crest and valley with the average height in the roughness curve as the center line. A surface having a skewness Rsk less than zero is a surface having a wider crest region than a valley region, and is typically a surface having wide crests and narrow valleys. On the other hand, a surface having a skewness Rsk larger than zero is a surface having a wider valley region than a crest region, and is typically a surface having wide valleys and narrow crests.

In the present preferred embodiment, the skewness Rsk (Rsk1) of the roughness curves of the first exposed surface 80AS and the second exposed surface 80BS is larger than the skewness Rsk (Rsk2) of the roughness curve of the third front surface 100S3 which is a surface of the core material. Thus, with the first exposed surface 80AS and the second exposed surface 80BS which are desired to exert a higher anchor effect between the wiring pattern 130 and their surfaces having a higher skewness Rsk than the third front surface 100S3 which is a surface of the core material, the adhesion force between the first exposed surface 80AS and the second exposed surface 80BS, and the wiring pattern 130 is improved, and the occurrence of peeling at this portion is able to be reduced or prevented. Therefore, a favorable electrical bonding state between the first exposed surface 80AS and the second exposed surface 80BS, and the wiring pattern 130, is able to be provided. Accordingly, the component built-in substrate 300 is able to reduce or prevent deterioration of the electrical connection state between the external electrode 40 and the wiring pattern of the substrate 100.

When the skewness Rsk is about −3 or less, since the valley where the wiring pattern 130 enters is narrow, the anchor effect tends to be less exhibited. Therefore, both the first skewness Rsk1 and the second skewness Rsk2 are preferably larger than about −3, for example. Accordingly, the anchor effect at the interface between the wiring patterns 130, and the third front surface 100S3, the first exposed surface 80AS, and the second exposed surface 80BS is able to be provided. On the other hand, when the skewness Rsk is about 1.5 or more, the wettability of the surface is lowered, and the bonding condition between the wiring patterns 130, and the first exposed surface 80AS and the second exposed surface 80BS is deteriorated. Therefore, it is preferable that the first skewness Rsk1 be smaller than about 1.5, for example. Therefore, by satisfying the above expression (5), the adhesion force and the connection stability at the interface between the wiring pattern 130, and the third front surface 100S3, the first exposed surface 80AS, and the second exposed surface 80BS are able to be improved. Accordingly, the deterioration of the electrical connection state between the external electrode 40 of the multilayer ceramic capacitor 1 and the wiring pattern 130 of the substrate 100 is able to be reduced or prevented.

The skewness Rsk is measured by the following process. First, the component built-in substrate 310 is embedded in a resin for sample preparation. Next, the component built-in substrate 310 embedded in the resin is cut in a cross section as shown in FIG. 9, and the cut surface is subjected to surface precision polishing by focused ion beam (FIB) processing. Next, in the polished cross section, the interface between the first exposed surface 80AS and the first wiring pattern 130A, the interface between the second exposed surface 80BS and the second wiring pattern 130B, and the interface between the third front surface 100S3 of the substrate 100 and the wiring pattern 130 are observed by scanning electron microscopy (SEM). Then, assuming that these interfaces observed by SEM are a cross-sectional curve of the first exposed surface 80AS, a cross-sectional curve of the second exposed surface 80BS, and a cross-sectional curve of the third front surface 100S3, a high-pass filter as defined in JIS B 0601:2013, 3.1.6 is applied for this cross-sectional curve, thereby providing a roughness curve of the first exposed surface 80AS, a roughness curve of the second exposed surface 80BS, and a roughness curve of the third front surface 100S3 of the substrate 100. Then, the skewness Rsk is calculated from these roughness curves based on the expression defined in JIS B 0601:2013, 4.2.3. The standard length defined in JIS B 0633, 7.2.1 is used as the standard length of the roughness curve when calculating the parameters. However, due to the dimension of the connection portion 80, if this reference length cannot be secured, a distance as long as possible to be set is used as the reference length. For each interface, the skewness Rsk is measured at five locations, and the average value thereof is set as the value of the skewness Rsk of the present preferred embodiment.

The sizes of the surface areas of the first exposed surface 80AS of the first connection portion 80A and the second exposed surface 80BS of the second connection portion 80B are not particularly limited. However, it is preferable that the surface areas of the first exposed surface 80AS and the second exposed surface 80BS fall within a predetermined range, for example.

More specifically, in a case in which the first connection portion 80A is provided on at least one surface of the first main surface TS1 or the second main surface TS2, assuming that the length in the length direction of the first external electrode 40A having the surface on which the first connection portion 80A is provided is L1, and the length in the width direction of the first external electrode 40A having the surface on which the first connection portion 80A is provided is W1, the surface area A2 of the first exposed surface 80AS preferably satisfies the following expression (6), for example. Furthermore, in a case in which the second connection portion 80B is provided on at least one surface of the first main surface TS1 or the second main surface TS2, assuming that the length in the length direction of the second external electrode 40B having the surface on which the second connection portion 80B is provided is L2, and the length in the width direction of the second external electrode 40B having the surface on which the second connection portion 80B is provided is W2, the surface area B2 of the second exposed surface 80BS preferably satisfies the below expression (7), for example. Thus, the contact area between the first exposed surface 80AS and the second exposed surface 80BS, and the wiring pattern 130 of the substrate 100, are able to be provided, and the adhesion force and the connection stability are able to be improved.

$$(L1 \times 0.03) \times (W1 \times 0.03) \le A2 \le L1 \times W1 \quad (6)$$

$$(L2 \times 0.03) \times (W2 \times 0.03) \le B2 \le L2 \times W2 \quad (7)$$

If the expressions (6) and (7) are expressed by the expressions (6B) and (7B) as described below, the value of α may be about 0.03. However, the value of α is preferably about 0.2, and more preferably about 0.5, for example. Accordingly, the adhesion force and the connection stability are able to be further improved. Furthermore, when the value of α is about 0.7, the area of about half or more of the area of the external electrode 40 is able to be effectively utilized on the surface on which the connection portion 80 is provided. Therefore, the adhesion force and the connection stability is able to be further improved.

$$(L1 \times \alpha) \times (W1 \times \alpha) \le A2 \le L1 \times W1 \quad (6B)$$

$$(L2 \times \alpha) \times (W2 \times \alpha) \le B2 \le L2 \times W2 \quad (7B)$$

In a case in which the first connection portion 80A is provided on at least one surface of the first side surface WS1 or the second side surface WS2, assuming that the length in the length direction of the first external electrode 40A having the surface on which the first connection portion 80A is provided is L1, and the length in the height direction of the first external electrode 40A having the surface on which the first connection portion 80A is provided is T1, the surface area A2 of the first exposed surface 80AS preferably satisfies the below expression (8), for example. Furthermore, in a case in which the second connection portion 80B is provided on at least one surface of the first side surface WS1 or the second side surface WS2, assuming that the length in the length direction of the second external electrode 40B having the surface on which the second connection portion 80B is provided is L2, and the length in the height direction of the second external electrode 40B having the surface on which the second connection portion 80B is provided is T2, the surface area B2 of the second exposed surface 80BS preferably satisfies the below expression (9), for example. Thus, the contact area between the first exposed surface 80AS and the second exposed surface 80BS, and the wiring pattern 130 of the substrate 100, is able to be provided, and the adhesion force and the connection stability are able to be improved.

$$(L1 \times 0.03) \times (T1 \times 0.03) \leq A1 \leq L1 \times T1 \tag{8}$$

$$(L2 \times 0.03) \times (T2 \times 0.03) \leq B1 \leq L2 \times T2 \tag{9}$$

If the expressions (8) and (9) are expressed by the expressions (8B) and (9B) as described below, the value of α may be 0.03. However, the value of α is preferably about 0.2, and more preferably about 0.5, for example. Accordingly, the adhesion force and the connection stability is able to be further improved. Furthermore, when the value of α is about 0.7, the area of about half or more of the area of the external electrode 40 is able to be effectively utilized on the surface on which the connection portion 80 is provided. Therefore, the adhesion force and the connection stability can be further improved.

$$(L1 \times \alpha) \times (T1 \times \alpha) \leq A2 \leq L1 \times T1 \tag{8B}$$

$$(L2 \times \alpha) \times (T2 \times \alpha) \leq B2 \leq L2 \times T2 \tag{9B}$$

The lengths T3 of the first connection portion 80A and the second connection portion 80B in the protruding direction are not particularly limited. However, it is preferable, for example, that the length T3 of the first connection portion 80A and the second connection portion 80B in the protruding direction be shorter than the length in the height direction T connecting the first main surface TS1 and the second main surface TS2 of the multilayer body 10 (i.e., the T dimension of the multilayer body 10). Accordingly, the first connection portion 80A and the second connection portion 80B are able to be reduced or prevented from being damaged by the effect of an external force. The length T3 of the first connection portion 80A and the second connection portion 80B in the protruding direction is preferably, for example, about 60% or less, preferably about 40% or less of the length in the height direction T connecting the first main surface TS1 and the second main surface TS2 of the multilayer body 10, and is preferably, for example, about 300 µm or less, preferably about 200 µm or less.

Furthermore, it is preferable, for example, that the length T3 of the first connection portion 80A in the protruding directions is longer than the thickness of the first external electrodes 40A in which the first connection portions 80A is provided. The length T3 in the protruding direction of the second connection portion 80B is preferably longer than the thickness of the second external electrodes 40B on which the second connection portion 80B is provided, for example. Thus, it is easy to connect the first connection portion 80A and the second connection portion 80B with the wiring pattern 130 of the substrate 100. More specifically, upon exposing the first exposed surface 80AS and the second exposed surface 80BS, the tolerance of the scraping quantity of the surface of the substrate 100 is widened. Furthermore, the degrees of freedom in the embedded position of the multilayer ceramic capacitor 1 with respect to the substrate 100 are able to be increased. The length T3 in the protruding direction of the first connection portion 80A and the second connection portion 80B is, for example, preferably about 20% or more, preferably about 30% or more of the length in the height direction T connecting the first main surface TS1 and the second main surface TS2 of the multilayer body 10, and is preferably about 100 µm or more, preferably about 150 µm or more, for example.

The number of the first connection portions 80A and the number of the second connection portions 80B may be singular or plural. The metal included in the first connection portion 80A and the second connection portion 80B preferably has a low-resistance and high-thermal conductivity, for example. For example, the material of at least the outermost surfaces of the first connection portion 80A and the second connection portion 80B is preferably Cu, for example. The above features are the same or substantially the same as those of the first preferred embodiment.

Next, a non-limiting example of a manufacturing process of the component built-in substrate 310 of the present preferred embodiment will be described with reference to FIGS. 11A to 11D.

As shown in FIG. 11A, the component built-in substrate in which the first exposed surface 80AS and the second exposed surface 80BS are exposed is provided. The component built-in substrate is able to be provided, for example, by polishing the first front surface 100S1 of the component built-in substrate 300 shown in FIG. 6G, which shows the manufacturing process in the first preferred embodiment. The second core material 120 of the substrate 100 at the time of polishing is in a cured state or a semi-cured state; however, it is preferable to be in a semi-cured state in consideration of processability, for example.

In this state, the third front surface 100S3 of the substrate 100 exposed by polishing is subjected to sandblasting. In sandblasting, the pressure and frequency of the discharge air of the sandblasting, the material and size of the blasting material, the discharge rate of the blasting material are adjusted so that the third front surface 100S3 of the substrate 100 becomes a surface having a predetermined skewness Rsk (Rsk2). At this time, the first exposed surface 80AS and the second exposed surface 80BS may be masked, or may be sandblasted together without being masked, for example.

Next, as shown in FIG. 11B, the mask 160 is provided on the third front surface 100S3 of the substrate 100 so that portions other than the first exposed surface 80AS and the second exposed surface 80BS are masked.

In this state, the first exposed surface 80AS and the second exposed surface 80BS are etched. In the etching process, the concentration of the etchant and the temperatures of the etchant are controlled and adjusted to provide the first exposed surface 80AS and the second exposed surface 80BS with a predetermined skewness Rsk (Rsk1). To provide the surface of the predetermined skewness Rsk, at least one etchant is selected and used among chloride-based etchants, for example, ferric chloride and cupric chloride, and peroxide-based etchants, for example, an etchant primarily including ammonium persulfate, an etchant of ammonium persulfate complexed with ammonia, an etchant primarily including sulfuric acid and hydrogen peroxide, an etchant including ammonia complexed with sulfuric acid and hydrogen peroxide, and an etchant primarily including chlorates.

After the etching process, the mask 160 is removed. Thereafter, as shown in FIG. 11C, a mask 170 for forming the wiring pattern 130 is provided to form the first wiring pattern 130A and the second wiring pattern 130B.

Figure 11D:
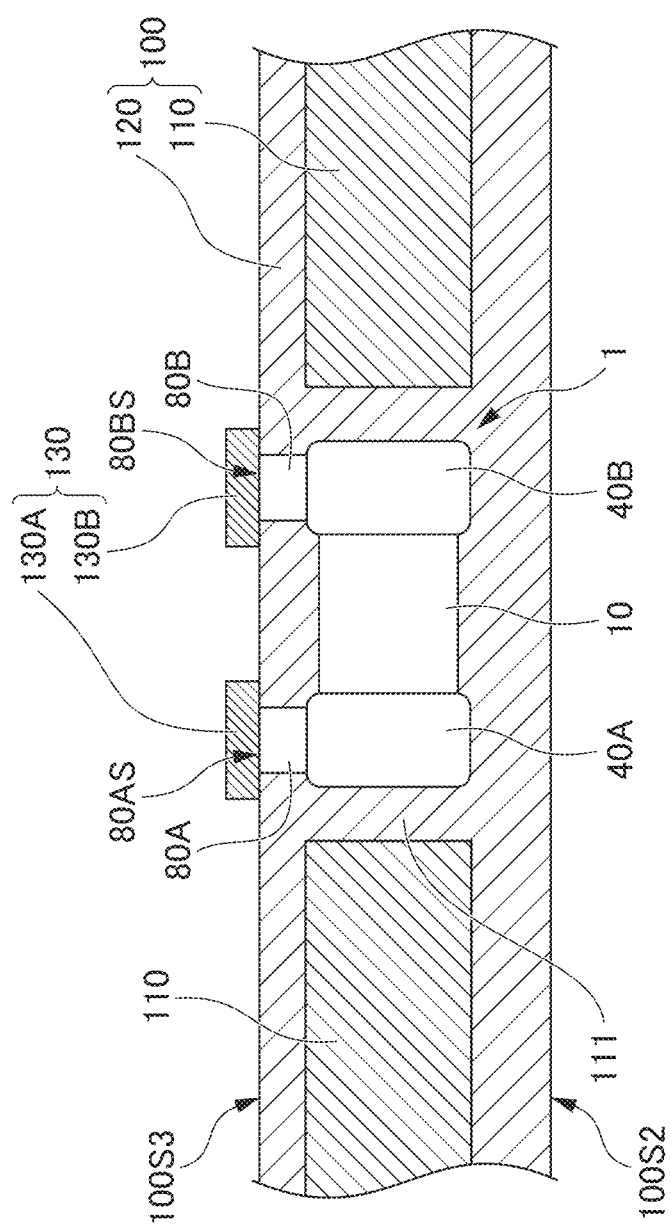
FIG. 11D shows the manufacturing process of the component built-in substrate of the second preferred embodiment of the present invention.

Next, as shown in FIG. 11D, the mask 170 is removed. Thereafter, the second core material 120 may be cured or may remain semi-cured. Thus, the component built-in substrate 310 is completed.

As described above, the manufacturing process of the component built-in substrate 310 of the present preferred embodiment includes providing the multilayer ceramic capacitor 1 including the first connection portion 80A provided to protrude from the first external electrode 40A and the second connection portion 80B provided to protrude from the second external electrode 40B; providing the core material included in the substrate 100; covering entirely the surface of the multilayer ceramic capacitor including the first connection portion 80A and the second connection portion 80B with the core material, and embedding the multilayer ceramic capacitor 1 in the core material; semi-curing or curing the core material; scraping the core material located in the direction of the first connection portion 80A protruding and the direction of the second connection portion 80B protruding, and exposing the surface of the first connection portion 80A and the surface of the second connection portion 80B covered by the core material; and forming the first wiring pattern 130A and the second wiring pattern 130B on the surface of the exposed first connection portion 80A and the surface of the exposed second connection portion 80B. Furthermore, the process may further include shipping the component built-in substrate 310. Thus, the generation of metal oxide on the surface of the external electrode 40 and the connection portion 80 is able to be reduced or prevented, and deterioration of the electrical connection state between the external electrode 40 and the wiring pattern 130 of the substrate 100 is able to be reduced or prevented.

Furthermore, according to the component built-in substrate 310 of the present preferred embodiment, with the first exposed surface 80AS and the second exposed surface 80BS which are desired to exert a higher anchor effect between the wiring pattern 130 and their surfaces having a higher skewness Rsk than the third front surface 100S3 which is a surface of the core material, the adhesion force and the connection stability between the first exposed surface 80AS and the second exposed surface 80BS, and the wiring pattern 130 is improved. Furthermore, by setting the first skewness Rsk1 and the second skewness Rsk2 larger than about −3, the anchor effect at the interface between the wiring pattern 130, and the third front surface 100S3, the first exposed surface 80AS, and the second exposed surface 80BS is able to be provided. Furthermore, by setting the first skewness Rsk1 smaller than about 1.5, the wettability of the surface is able to be provided, and a favorable bonding state between the first exposed surface 80AS and the second exposed surface 80BS, and the wiring pattern 130, is also able to be provided. In the above preferred embodiment, sandblasting and etching are performed in order to provide a predetermined surface state; however, the processing is not limited to these processes.

In general, in the manufacturing process of the component built-in substrate as shown in Japanese Unexamined Patent Application, Publication Nos. 2014-183104 and 2014-138172, in a case of electrically connecting the external electrode and the wiring pattern using a via hole conductor, if the connection state between the via hole conductor and the wiring pattern is deteriorated, contact failure, for example, peeling, occurs in this portion, and thus, there is a possibility that the electrical connection state between the external electrode and the wiring member is deteriorated. However, with the features of the present preferred embodiment, the problem of peeling of the wiring pattern is able to be reduced or prevented, and thus, the deterioration of the electrical connection state between the external electrode and the wiring pattern is able to be reduced or prevented.

FIG. 12 is a cross-sectional view showing a first modified example of the component built-in substrate 310 of the present preferred embodiment. However, the multilayer ceramic capacitor 1 embedded in the substrate 100 is not shown in a cross-sectional view, but by an external view.

In the above preferred embodiment, the second connection portion 80B is provided on the first main surface TS1 via the second external electrodes 40B. However, in the present modified example, similar to the first modification of the first preferred embodiment, the second connection portion 80B is provided on the second main surface TS2 via the second external electrodes 40B.

As shown in FIG. 12, the second connection portion 80B includes a second exposed surface 80BS which is exposed from the surface of the substrate 100. The second exposed surface 80BS and a fourth front surface 100S4 of the substrate 100 are formed, for example, by scraping off the vicinity of the surface layer of the second front surface 100S2 of the component built-in substrate 300 with which the manufacturing process is described in the first preferred embodiment, and further optionally performing surface treatment, for example, sandblasting or etching as described above. In the present modified example, the fourth front surface 100S4 of the substrate 100 is a surface of the core material continuous with the second exposed surface 80BS.

Accordingly, by providing the first connection portion 80A and the second connection portion 80B on different surfaces of the multilayer body 10, wiring using the upper and lower surfaces of the substrate 100, for example, may be performed. Therefore, the degrees of freedom in the wiring pattern 130 with respect to the substrate 100 are able to be significantly increased.

Figure 13:
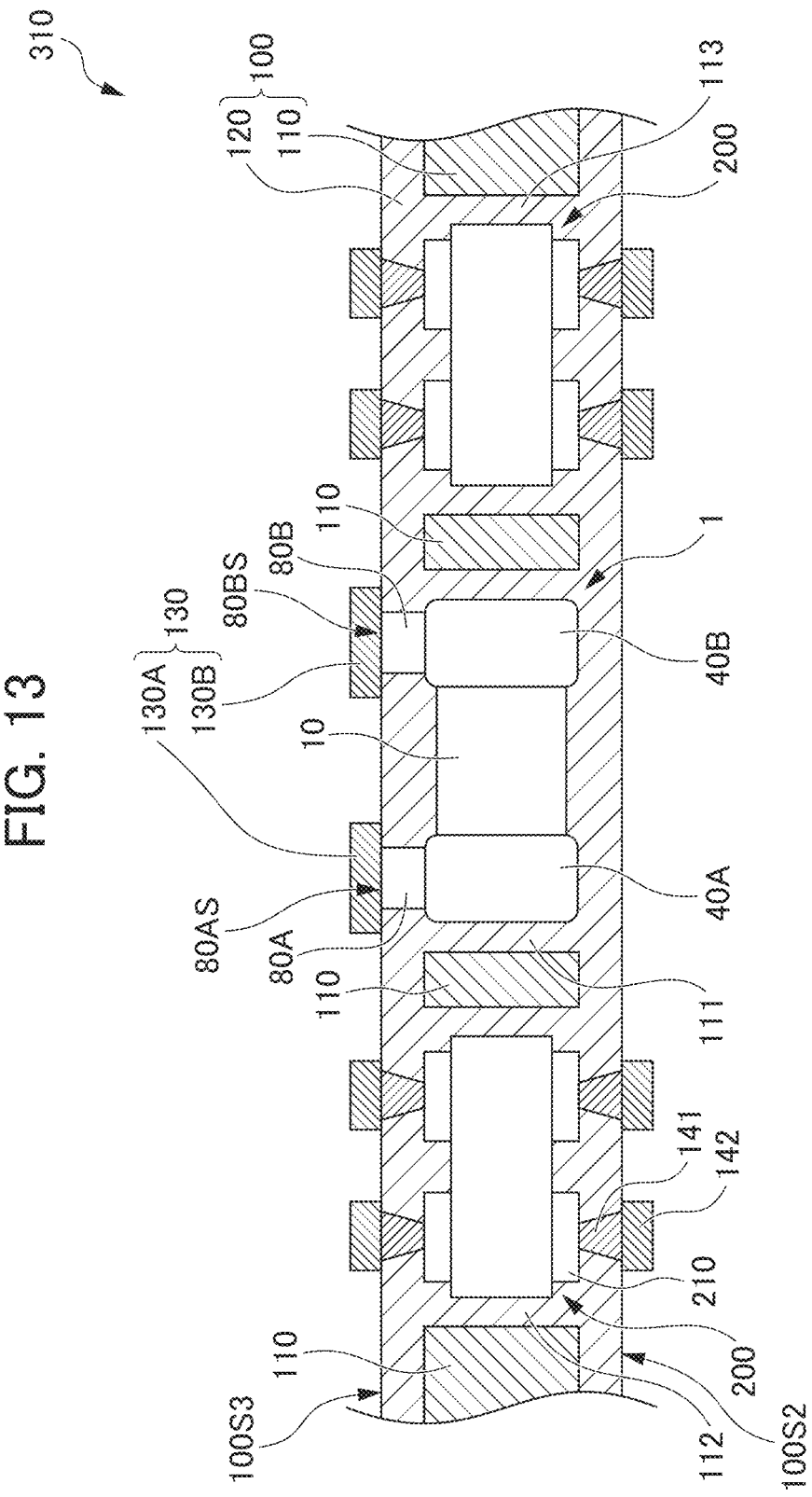
FIG. 13 is a cross-sectional view showing a second modified example of the component built-in substrate of the second preferred embodiment of the present invention.

FIG. 13 is a cross-sectional view showing a second modified example of the component built-in substrate 310 of the present preferred embodiment. However, the multilayer ceramic capacitor 1 and other electronic components 200 which are embedded in the substrate 100 are not shown by a cross-sectional view, but by an external view.

In the above preferred embodiment, only the multilayer ceramic capacitor 1 is embedded in the substrate 100. However, in this modified example, other electronic components 200 in addition to the multilayer ceramic capacitor 1 are also embedded in the substrate 100.

As shown in FIG. 13, the electrode 210 of the electronic component 200 and a wiring pattern 142 of the substrate 100 are electrically connected with each other via a via hole conductor 141.

Thus, the component built-in substrate 310 may include other electronic components 200 in addition to the multilayer ceramic capacitor 1. There is no particular limitation on the number of multilayer ceramic capacitor 1 to be embedded in the substrate 100, and one or a plurality of multilayer ceramic capacitor 1 may be embedded in the substrate 100.

According to the component built-in substrate 310 of the present preferred embodiment, the following advantages are provided by the first preferred embodiment.

A component built-in substrate 310 according to the present preferred embodiment includes a multilayer body 10 including a plurality of stacked ceramic layers 20 and a plurality of stacked inner conductive layers 30, the multilayer body further including a first main surface TS1 and a second main surface TS2 on opposite sides in a height direction, a first side surface WS1 and a second side surface WS2 on opposite sides in a width direction orthogonal or substantially orthogonal to the height direction, and a first end surface LS1 and a second end surface LS2 on opposite sides in a length direction orthogonal or substantially orthogonal to the height direction and the width direction; a multilayer ceramic electronic component 1 including a first external electrode 40A provided adjacent to or in a vicinity of the first end surface LS1 of the multilayer body 10 and connected to the inner conductive layer 30, and a second external electrode 40B provided adjacent to or in a vicinity of the second end surface LS2 of the multilayer body 10 and connected to the inner conductive layer 30; and a substrate 100 including the multilayer ceramic electronic component 1 embedded therein, wherein the multilayer ceramic electronic component 1 includes a first connection portion 80A that protrudes from the first external electrode 40A, and a second connection portion 80B that protrudes from the second external electrode 40B; the substrate 100 includes a core material, a first wiring pattern 130A that is provided on a surface of the core material, and electrically connected to the first external electrode 40A, and a second wiring pattern 130B that is provided on a surface of the core material, and electrically connected to the second external electrode 40B; the multilayer ceramic electronic component 1 including the first connection portion 80A and the second connection portion 80B includes a surface covered by the core material and embedded in the substrate 100; the first connection portion 80A protrudes toward a surface of the substrate 100, and includes a first exposed surface 80AS exposed from the surface of the substrate 100; the second connection portion 80B protrudes toward a surface of the substrate 100, and includes a second exposed surface 80BS exposed from the surface of the substrate 100; the first wiring pattern 130A is provided on the first exposed surface 80AS; the second wiring pattern 130B is provided on the second exposed surface 80BS; and a skewness Rsk of roughness curves of the first exposed surface 80AS and the second exposed surface 80BS is larger than a skewness Rsk of roughness curves of a surface of the core material continuous with the first exposed surface 80AS and a surface of the core material continuous with the second exposed surface 80BS. Accordingly, the component built-in substrate 310 is able to be provided while reducing or preventing deterioration of the electrical connection state between the external electrode 40 and the wiring pattern of the substrate 100.

According to the present preferred embodiment, a first skewness Rsk1 which is a value of the skewness Rsk of the roughness curves of the first exposed surface 80AS and the second exposed surface 80BS, and a second skewness Rsk2 which is a value of the skewness Rsk of roughness curves of the surface of the core material continuous with the first exposed surface 80AS and the surface of the core material continuous with the second exposed surface 80BS satisfy expression (5) below. Accordingly, the adhesion force and the connection stability at the interface between the wiring pattern 130, and the third front surface 100S3, the first exposed surface 80AS, and the second exposed surface 80BS are able to be improved. Accordingly, the deterioration of the electrical connection state between the external electrode 40 of the multilayer ceramic capacitor 1 and the wiring pattern 130 of the substrate 100 is able to be reduced or prevented.

$$-3 < Rsk2 < Rsk1 < 1.5 \quad (5)$$

According to the present preferred embodiment, the first connection portion 80A is provided on at least one of the first main surface TS1 or the second main surface TS2; the second connection portion 80B is provided on at least one of the first main surface TS1 or the second main surface TS2; when defining a length in the length direction of the first external electrode 40A having a surface on which the first connection portion 80A is provided as L1, a length in the width direction of the first external electrode 40A having the surface on which the first connection portion 80A is provided as W1, a length in the length direction of the second external electrode 40B having a surface on which the second connection portion 80B is provided as L2, and a length in the width direction of the second external electrode 40B having the surface on which the second connection portion 80B is provided as W2, a surface area A2 of the first exposed surface 80AS satisfies expression (6) below, and a surface area B2 of the second exposed surface 80BS satisfies expression (7) below. Thus, the contact area between the first connection portion 80A and the second connection portion 80B, and the wiring pattern of the substrate 100, is able to be provided, and the adhesion force and the connection stability are able to be significantly improved.

$$(L1 \times 0.03) \times (W1 \times 0.03) \leq A2 \leq L1 \times W1 \quad (6)$$

$$(L2 \times 0.03) \times (W2 \times 0.03) \leq B2 \leq L2 \times W2 \quad (7)$$

According to the present preferred embodiment, the first connection portion 80A is provided on at least one of the first side surface WS1 and the second side surface WS2; the second connection portion 80B is provided on at least one of the first side surface WS1 and the second side surface WS2; when defining a length in the length direction of the first external electrode 40A having a surface on which the first connection portion 80A is provided as L1, a length in the height direction of the first external electrode 40A having the surface on which the first connection portion 80A is provided as T1, a length in the length direction of the second external electrode 40B having a surface on which the second connection portion 80B is provided as L2, and a length in the height direction of the second external electrode 40B having the surface on which the second connection portion 80B is provided as T2, a surface area A2 of the first exposed surface 80AS satisfies expression (8) below, and a surface area B2 of the second exposed surface 80BS satisfies expression (9) below. Thus, the contact area between the first connection portion 80A and the second connection portion 80B, and the wiring pattern of the substrate 100, is able to be provided, and the adhesion force and the connection stability are able to be improved.

$$(L1 \times 0.03) \times (T1 \times 0.03) \leq A2 \leq L1 \times T1 \quad (8)$$

$$(L2 \times 0.03) \times (T2 \times 0.03) \leq B2 \leq L2 \times T2 \quad (9)$$

The features of the multilayer ceramic capacitor 1 is not limited to the features shown in FIGS. 3 to 5. For example, the multilayer ceramic capacitor 1 may be a multilayer ceramic capacitor having a two-part structure, three-part structure, or four-part structure, as shown in FIGS. 14A to 14C.

Figure 14A:
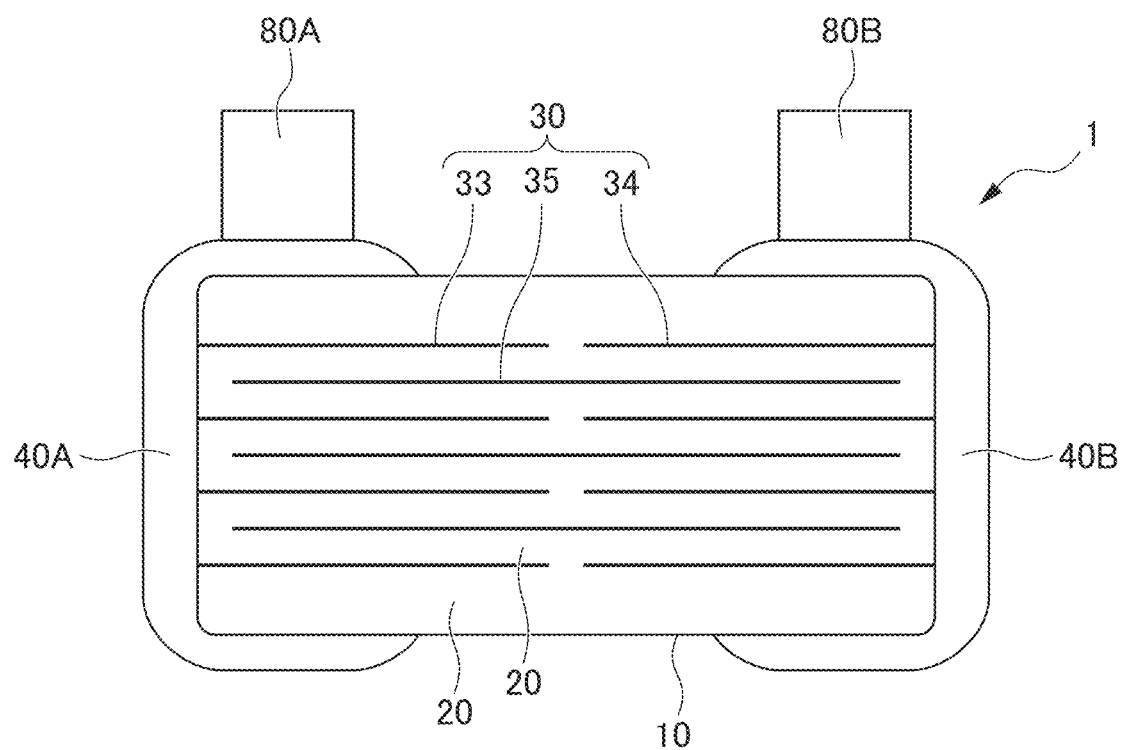
FIG. 14A is a diagram showing a multilayer ceramic capacitor having a two-part structure.
Figure 14B:
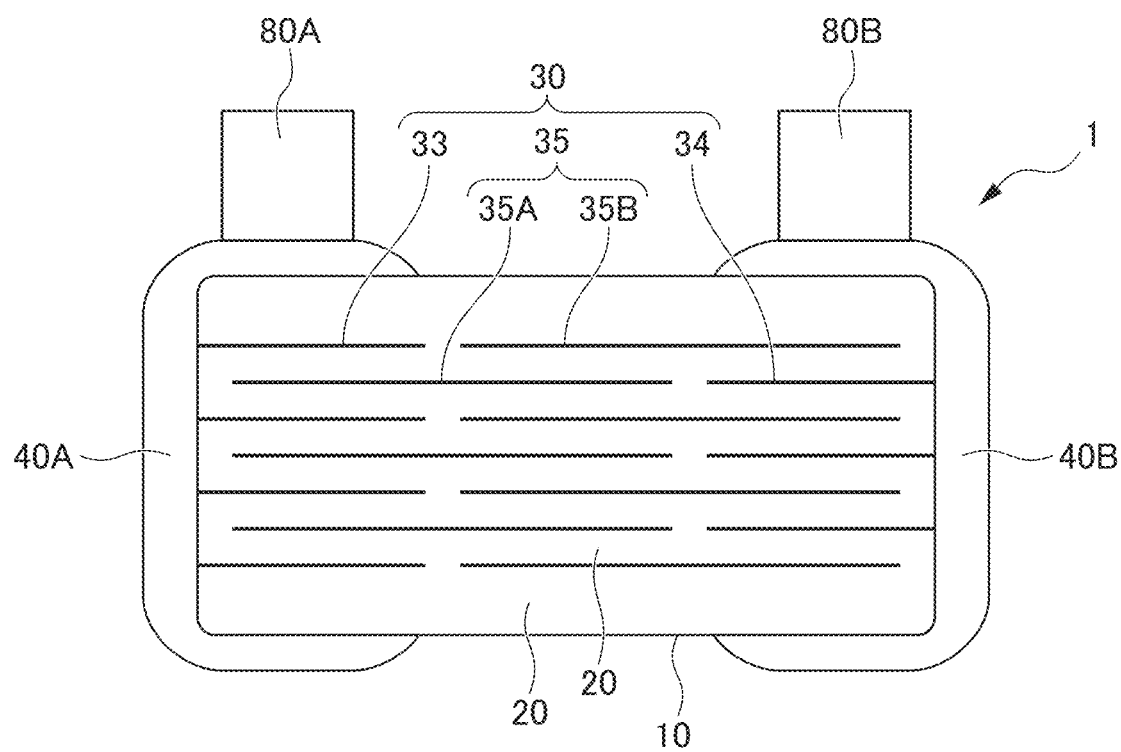
FIG. 14B is a diagram showing a multilayer ceramic capacitor having a three-part structure.
Figure 14C:
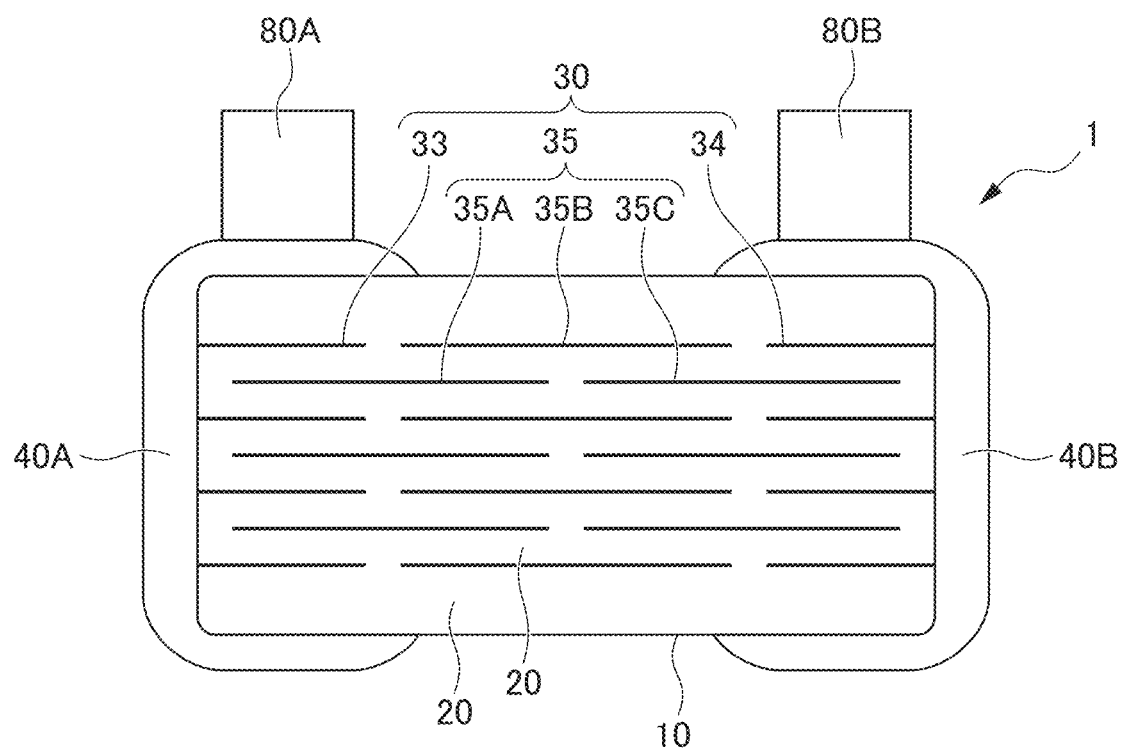
FIG. 14C is a diagram showing a multilayer ceramic capacitor having a four-part structure.

The multilayer ceramic capacitor 1 shown in FIG. 14A is a multilayer ceramic capacitor 1 having a two-part structure, and includes, as the internal electrode layer 30, a floating internal electrode layer 35 which is drawn to neither the first end surface LS1 nor the second end surface LS2, in addition to the first internal electrode layer 33 and the second internal electrode layer 34. The multilayer ceramic capacitor 1 shown in FIG. 14B is a multilayer ceramic capacitor 1 having a three-part structure, and includes, as the floating internal electrode layer 35, a first floating internal electrode layer 35A and a second floating internal electrode layer 35B. The multilayer ceramic capacitor 1 shown in FIG. 14C is a multilayer ceramic capacitor 1 having a four-part structure, and includes, as the floating internal electrode layer 35, the first floating internal electrode layer 35A, the second floating internal electrode layer 35B and a third floating internal electrode layer 35C. Thus, by providing the floating internal electrode layer 35 as the internal electrode layer 30, the multilayer ceramic capacitor 1 has a structure in which the counter electrode portion is divided into a plurality of electrode portions. Thus, a plurality of capacitor components are provided between the opposing internal electrode layers 30, and the capacitor components are connected in series. Therefore, the voltage applied to the respective capacitor components becomes low, and thus, a high breakdown voltage of the multilayer ceramic capacitor 1 is able to be provided. The multilayer ceramic capacitor 1 of the present preferred embodiment may be a multiple structure of four or more parts.

The multilayer ceramic capacitor 1 may be of the two-terminal type including two external electrodes, or may be of the multi-terminal type including a large number of external electrodes.

In addition, in the preferred embodiment described above, a multilayer ceramic capacitor using a dielectric ceramic has been exemplified as the multilayer ceramic electronic component; however, the multilayer ceramic electronic component of the present invention is not limited thereto, and is also applicable to various multilayer ceramic electronic components, for example, a piezoelectric component using a piezoelectric ceramic, a thermistor using a semiconductor ceramic, and an inductor using a magnetic ceramic. Examples of the piezoelectric ceramic include PZT (lead zirconate titanate) based ceramics and the like. Examples of the semiconductor ceramic include spinel-based ceramics and the like. Examples of the magnetic ceramics include ferrite and the like.

The present invention is not limited to the features of the above preferred embodiments, and is able to be modified and applied without changing the gist and scope of the present invention. The present invention also includes the combinations of two or more of the individual features described in the above preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component built-in substrate comprising:
   a multilayer body including a plurality of stacked ceramic layers and a plurality of stacked inner conductive layers, the multilayer body further including a first main surface and a second main surface on opposite sides of the multilayer body in a height direction, a first side surface and a second side surface on opposite sides of the multilayer body in a width direction orthogonal or substantially orthogonal to the height direction, and a first end surface and a second end surface on opposite sides of the multilayer body in a length direction orthogonal or substantially orthogonal to the height direction and the width direction;
   a multilayer ceramic electronic component including a first external electrode adjacent to or in a vicinity of the first end surface of the multilayer body and connected to the inner conductive layer, and a second external electrode adjacent to or in a vicinity of the second end surface of the multilayer body and connected to the inner conductive layer; and
   a substrate including the multilayer ceramic electronic component embedded therein; wherein the multilayer ceramic electronic component includes a first connection portion that protrudes from the first external electrode, and a second connection portion that protrudes from the second external electrode;
   the substrate includes a core material, a first wiring pattern that is provided on a surface of the core material, and electrically connected to the first external electrode, and a second wiring pattern that is provided on a surface of the core material, and electrically connected to the second external electrode;
   the multilayer ceramic electronic component including the first connection portion and the second connection portion includes a surface covered by the core material and embedded in the substrate;
   the first connection portion protrudes toward a surface of the substrate, and includes a first exposed surface exposed from the surface of the substrate;
   the second connection portion protrudes toward a surface of the substrate, and includes a second exposed surface exposed from the surface of the substrate;
   the first wiring pattern is on the first exposed surface;
   the second wiring pattern is on the second exposed surface; and
   a skewness of roughness curves of the first exposed surface and the second exposed surface is larger than a skewness Rsk of roughness curves of a surface of the core material continuous with the first exposed surface and a surface of the core material continuous with the second exposed surface.

2. The component built-in substrate according to claim 1, wherein a first skewness Rsk1 which is a value of the skewness of the roughness curves of the first exposed surface and the second exposed surface, and a second skewness Rsk2 which is a value of the skewness of roughness curves of the surface of the core material continuous with the first exposed surface and the surface of the core material continuous with the second exposed surface satisfy expression (5) below, $$-3<Rsk2<Rsk1<1.5 \tag{5}$$

3. The component built-in substrate according to claim 1, wherein
   the first external electrode is on at least one of the first main surface, the second main surface, the first side surface, and the second side surface, in addition to the first end surface; and
   the second external electrode is on at least one of the first main surface, the second main surface, the first side surface, and the second side surface, in addition to the second end surface.

4. The component built-in substrate according to claim 1, wherein
   the first connection portion is on at least one of the first end surface, the first main surface, the second main surface, the first side surface, and the second side surface on which the first external electrode exists; and the second connection portion is on at least one of the second end surface, the first main surface, the second main surface, the first side surface, and the second side surface on which the second external electrode exists.

5. The component built-in substrate according to claim 1, wherein the first connection portion includes a longer length in the protruding direction than a thickness of the first external electrode on which the first connection portion is provided; and the second connection portion includes a longer length in the protruding direction than a thickness of the second external electrode on which the second connection portion is provided.

6. The component built-in substrate according to claim 1, wherein the first connection portion is on at least one of the first main surface or the second main surface;

the second connection portion is on at least one of the first main surface or the second main surface;

when defining a length in the length direction of the first external electrode having a surface on which the first connection portion is provided as L1, a length in the width direction of the first external electrode having the surface on which the first connection portion is provided as W1, a length in the length direction of the second external electrode having a surface on which the second connection portion is provided as L2, and a length in the width direction of the second external electrode having the surface on which the second connection portion is provided as W2;

a surface area A2 of the first exposed surface satisfies expression (6) below; and a surface area B2 of the second exposed surface satisfies expression (7) below, $$(L1 \times 0.03) \times (W1 \times 0.03) \leq A2 \leq L1 \times W1 \quad (6),$$

$$(L2 \times 0.03) \times (W2 \times 0.03) \leq B2 \leq L2 \times W2 \quad (7).$$

7. The component built-in substrate according to claim 1, wherein the first connection portion is on at least one of the first side surface and the second side surface;

the second connection portion is on at least one of the first side surface and the second side surface;

when defining a length in the length direction of the first external electrode having a surface on which the first connection portion is provided as L1, a length in the height direction of the first external electrode having the surface on which the first connection portion is provided as T1, a length in the length direction of the second external electrode having a surface on which the second connection portion is provided as L2, and a length in the height direction of the second external electrode having the surface on which the second connection portion is provided as T2;

a surface area A2 of the first exposed surface satisfies expression (8) below; and a surface area B2 of the second exposed surface satisfies expression (9) below, $$(L1 \times 0.03) \times (T1 \times 0.03) \leq A2 \leq L1 \times T1 \quad (8),$$

$$(L2 \times 0.03) \times (T2 \times 0.03) \leq B2 \leq L2 \times T2 \quad (9).$$

* * * * *